(12) United States Patent
Nagamori et al.

(10) Patent No.: US 11,757,482 B2
(45) Date of Patent: Sep. 12, 2023

(54) FRONTEND CIRCUIT, FRONTEND MODULE, COMMUNICATION APPARATUS, AND MULTIPLEXER

(71) Applicant: Murata Manufacturing Co., Ltd., Kyoto (JP)

(72) Inventors: Hiroyuki Nagamori, Kyoto (JP); Akio Kaneda, Kyoto (JP); Hiroshi Muranaka, Kyoto (JP); Hideki Tsukamoto, Kyoto (JP); Daisuke Ito, Kyoto (JP); Kiwamu Sakano, Kyoto (JP); Daisuke Miyazaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 205 days.

(21) Appl. No.: 16/999,534

(22) Filed: Aug. 21, 2020

(65) Prior Publication Data

US 2020/0382149 A1 Dec. 3, 2020

Related U.S. Application Data

(63) Continuation of application No. PCT/JP2019/007498, filed on Feb. 27, 2019.

(30) Foreign Application Priority Data

Mar. 15, 2018 (JP) ................................. 2018-047516

(51) Int. Cl.
*H04B 1/18* (2006.01)
*H04B 1/52* (2015.01)
(Continued)

(52) U.S. Cl.
CPC ............. *H04B 1/18* (2013.01); *H03F 3/193* (2013.01); *H03F 3/245* (2013.01); *H04B 1/52* (2013.01);
(Continued)

(58) Field of Classification Search
None
See application file for complete search history.

(56) References Cited

U.S. PATENT DOCUMENTS 5,987,304 A * 11/1999 Latt .................... H04B 7/15528
455/22
8,737,376 B2 * 5/2014 Park ........................ H04B 1/44
370/329
(Continued)

FOREIGN PATENT DOCUMENTS

JP 2000-261345 A 9/2000
JP 2015-514381 A 5/2015
(Continued)

OTHER PUBLICATIONS

International Search Report for PCT/JP2019/007498 dated May 28, 2019.
Written Opinion for PCT/JP2019/007498 dated May 28, 2019.

*Primary Examiner* — Pablo N Tran
(74) *Attorney, Agent, or Firm* — Pearne & Gordon LLP

(57) ABSTRACT

A frontend circuit includes a wide-band filter, a transmit filter, and switches. The wide-band filter passes both the receive frequency band of a first communication frequency band and that of a second communication frequency band which is close to or overlaps that of the first communication frequency band. The transmit filter passes the transmit frequency band of the first or second communication frequency band. The switches are capable of simultaneously bringing, into conduction, at least two of multiple filters including the wide-band filter and the transmit filter. In carrier aggregation using the receive frequency bands of the first and second communication frequency bands, the switches simultaneously bring the wide-band filter and the transmit filter into conduction. Thus, in carrier aggregation using signals of multiple communication frequencies simul-
(Continued)

taneously in communication, attenuation of signals due to signal leakage in two receive frequency bands, which are close to each other, is suppressed.

20 Claims, 24 Drawing Sheets

(51) Int. Cl.
    *H03F 3/24*         (2006.01)
    *H04B 7/04*         (2017.01)
    *H03F 3/193*       (2006.01)

(52) U.S. Cl.
    CPC .......... *H04B 7/04* (2013.01); *H03F 2200/165* (2013.01); *H03F 2200/294* (2013.01)

(56) References Cited

U.S. PATENT DOCUMENTS

| | | | |
|---|---|---|---|
| 10,840,887 B2 * | 11/2020 | Schmalzl | ............... H04B 1/525 |
| 2008/0198776 A1 * | 8/2008 | Seo | .......................... H04B 1/48 |
| | | | 370/280 |
| 2013/0273861 A1 | 10/2013 | See | |
| 2014/0329475 A1 | 11/2014 | Ellä et al. | |
| 2017/0338851 A1 | 11/2017 | Sugaya | |
| 2018/0343000 A1 | 11/2018 | Nosaka | |
| 2019/0115947 A1 | 4/2019 | Nosaka | |
| 2019/0181907 A1 * | 6/2019 | Pfann | ..................... H03H 9/584 |

FOREIGN PATENT DOCUMENTS

| | | |
|---|---|---|
| JP | 2017-208656 A | 11/2017 |
| WO | 2013/041146 A1 | 3/2013 |
| WO | 2013/047357 A1 | 4/2013 |
| WO | 2017/138539 A1 | 8/2017 |
| WO | 2017/199649 A1 | 11/2017 |

* cited by examiner

<COMPARISON EXAMPLE>

FRONTEND CIRCUIT, FRONTEND MODULE, COMMUNICATION APPARATUS, AND MULTIPLEXER

This is a continuation of International Application No. PCT/JP2019/007498 filed on Feb. 27, 2019, which claims priority from Japanese Patent Application No. 2018-047516 filed on Mar. 15, 2018. The contents of these applications are incorporated herein by reference in their entireties.

BACKGROUND OF THE DISCLOSURE

1. Field of the Disclosure

The present disclosure relates to a multiplexer, which is connected to an antenna through which radio-frequency signals are received/transmitted, a frontend circuit including the multiplexer, and a frontend module and a communication apparatus including the frontend circuit.

2. Description of the Related Art

International Publication No. 2013/041146 describes a frontend circuit which performs carrier aggregation by using multiple duplexers simultaneously. In the frontend circuit, switches are disposed between the duplexers and antennas.

Assume the case in which the frontend circuit described in International Publication No. 2013/041146 performs two-downlink carrier aggregation, in which a signal in the receive frequency band of a first communication frequency band and a signal in the receive frequency band of a second communication frequency band are received simultaneously, and in which the receive frequency band of the first communication frequency band is close to the receive frequency band of the second communication frequency band. In this case, portions of a signal, which is to pass through a first receive filter passing the receive frequency band of the first communication frequency band, leak to a filter passing the receive frequency band of the second communication frequency band, resulting in a problem of attenuation of receive signals in the first communication frequency band.

BRIEF SUMMARY OF THE DISCLOSURE

An object of the present disclosure is to provide a multiplexer having a wide-band filter, a frontend circuit having the multiplexer, and a frontend module and a communication apparatus having the frontend circuit. In carrier aggregation using multiple frequency bands, the wide-band filter suppresses attenuation of signals due to signal leakage in two receive frequency bands close to each other.

(1) A frontend circuit as an example of the present disclosure is applied to carrier aggregation using a plurality of communication frequency bands including a first communication frequency band and a second communication frequency band. The frontend circuit includes a wide-band filter that passes the first communication frequency band and the second communication frequency band. The first communication frequency band is close to or overlaps the second communication frequency band. In the carrier aggregation, the first communication frequency band and the second communication frequency band pass through the wide-band filter.

In application to carrier aggregation which simultaneously uses the first communication frequency band and the second communication frequency band, the configuration, which uses the wide-band filter passing both the first communication frequency band and the second communication frequency band, causes signals in the first communication frequency band and signals in the second communication frequency band to pass through the wide-band filter, achieving suppression of attenuation of both signals in the first communication frequency band and signals in the second communication frequency band.

(2) The frontend circuit, according to (1), as an example of the present disclosure further includes a first filter that passes the first communication frequency band selectively. In a single use of the first communication frequency band, the wide-band filter is isolated, and the first communication frequency band passes through the first filter. This configuration uses the first filter, having a narrow band, in a single use of the first communication frequency band, achieving further suppression of signal leakage (interference) from/to a different communication frequency band contiguous to the first communication frequency band.

(3) In the frontend circuit, according to (1), as an example of the present disclosure, in a single use of the first communication frequency band or the second communication frequency band, the first communication frequency band or the second communication frequency band passes through the wide-band filter. This configuration does not need a narrow-band filter for the first communication frequency band or the second communication frequency band, achieving a reduction in size and cost.

(4) The frontend circuit, according to (3), as an example of the present disclosure further includes a third filter that passes a third communication frequency band. The third filter has a pass frequency band different from a pass frequency band of the wide-band filter. In carrier aggregation using the first communication frequency band or the second communication frequency band, and the third communication frequency band, the first communication frequency band or the second communication frequency band passes through the wide-band filter. This configuration does not need a narrow-band filter for the first communication frequency band or the second communication frequency band even in carrier aggregation using the first communication frequency band or the second communication frequency band, and the third communication frequency band, achieving a reduction in size and cost.

(5) The frontend circuit, according to (1), as an example of the present disclosure further includes a first filter that passes the first communication frequency band, and a fourth filter that passes a fourth communication frequency band. The frontend circuit is applied to carrier aggregation using the first communication frequency band and the fourth communication frequency band. The fourth communication frequency band overlaps the second communication frequency band at least partially. In carrier aggregation using the first communication frequency band and the fourth communication frequency band, the wide-band filter is isolated, the first communication frequency band passes through the first filter, and the fourth communication frequency band passes through the fourth filter. This configuration enables even signals in the fourth communication frequency band, which overlaps the passband of the wide-band filter, to be used in carrier aggregation.

(6) The frontend circuit, according to (1), as an example of the present disclosure further includes a first filter that passes the first communication frequency band, and a fourth filter that passes a fourth communication frequency band. The frontend circuit is applied to carrier aggregation using the first communication frequency band and the fourth communication frequency band. There is no overlapping range between the fourth communication frequency band and the first communication frequency band. In carrier aggregation using the first communication frequency band and the fourth communication frequency band, the wide-band filter is isolated, the first communication frequency band passes through the first filter, and the fourth communication frequency band passes through the fourth filter. This configuration does not need a narrow-band filter for the first communication frequency band or the second communication frequency band, achieving a reduction in size and cost.

(7) In the frontend circuit, according to (1), as an example of the present disclosure, the plurality of communication frequency bands include a third communication frequency band which overlaps the second communication frequency band. The wide-band filter is a variable bandpass filter having a passband width. The passband width is switched in accordance with a control signal between a first case and a second case. The first case is carrier aggregation using the first communication frequency band and the second communication frequency band. The second case is carrier aggregation using the first communication frequency band and the third communication frequency band.

(8) The frontend circuit, according to (1), as an example of the present disclosure further includes a multiplexer that includes an input port for a transmit signal in the first communication frequency band, an input port for a transmit signal in the second communication frequency band, an output port for a receive signal in the first communication frequency band and the second communication frequency band, and a common input/output port. This configuration reduces the number of filters serving as surface mounted components, achieving a further reduction in the size of the apparatus.

(9) A frontend module as an example of the present disclosure includes the frontend circuit and a low-noise amplifier circuit which performs low-noise amplification on a receive signal having passed through the wide-band filter. The configuration may be used as a module including a frontend circuit and a low-noise amplifier circuit.

(10) The frontend module, according to (9), as an example of the present disclosure further includes a distribution circuit that distributes a receive signal or an output signal. The receive signal has passed through the wide-band filter. The output signal is a signal from the low-noise amplifier circuit. This configuration may supply signals in multiple receive frequency bands, which pass through the wide-band filter, to corresponding receive circuits.

(11) A frontend module as an example of the present disclosure includes the frontend circuit, a transmit filter that passes a transmit frequency band of the first communication frequency band or a transmit frequency band of the second communication frequency band, and a power amplifier circuit that amplifies power of a transmit signal which is to be input to the transmit filter. This configuration may be used as a module including a frontend circuit and a power amplifier circuit.

(12) A communication apparatus as an example of the present disclosure includes the frontend module and a communication circuit that is connected to the frontend module. This configuration may obtain a communication apparatus which is capable of performing carrier aggregation using multiple communication frequency bands including two communication frequency bands which are close to or overlap each other.

(13) A multiplexer as an example of the present disclosure is applied to carrier aggregation using a plurality of communication frequency bands including a first communication frequency band and a second communication frequency band. The first communication frequency band is close to or overlaps the second communication frequency band. The multiplexer includes a wide-band filter that passes the first communication frequency band and the second communication frequency band. In the carrier aggregation, the first communication frequency band and the second communication frequency band pass through the wide-band filter. This configuration may reduce the number of filters serving as surface mounted components, achieving a reduction in the size of the apparatus.

(14) A multiplexer as an example of the present disclosure further includes an input port for a transmit signal in the first communication frequency band, an input port for a transmit signal in the second communication frequency band, an output port for a receive signal in the first communication frequency band and the second communication frequency band, and a common input/output port. The wide-band filter is disposed between the output port for the receive signal and the common input/output port. This configuration enables application to a multiplexer which multiplexes transmit signals and receive signals.

The present disclosure provides a frontend circuit, and a frontend module and a communication apparatus including the frontend circuit. In carrier aggregation using multiple frequency bands, the frontend circuit suppresses attenuation of signals due to signal leakage in two receive frequency bands close to each other.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Referring to the figures, multiple embodiments for carrying out the present disclosure will be described below by taking some concrete examples. In the figures, identical points are designated with identical reference numbers. In consideration of ease of description or understanding of points, the embodiments are indicated separately for convenience sake of description. However, partial replacement or combination of the configurations described in different embodiments may be made. In a second embodiment and its subsequent embodiments, points common to those in a first embodiment will not be described, and only different points will be described. In particular, similar effects caused by similar configurations will not be described in each embodiment.

First Embodiment

Figure 1:
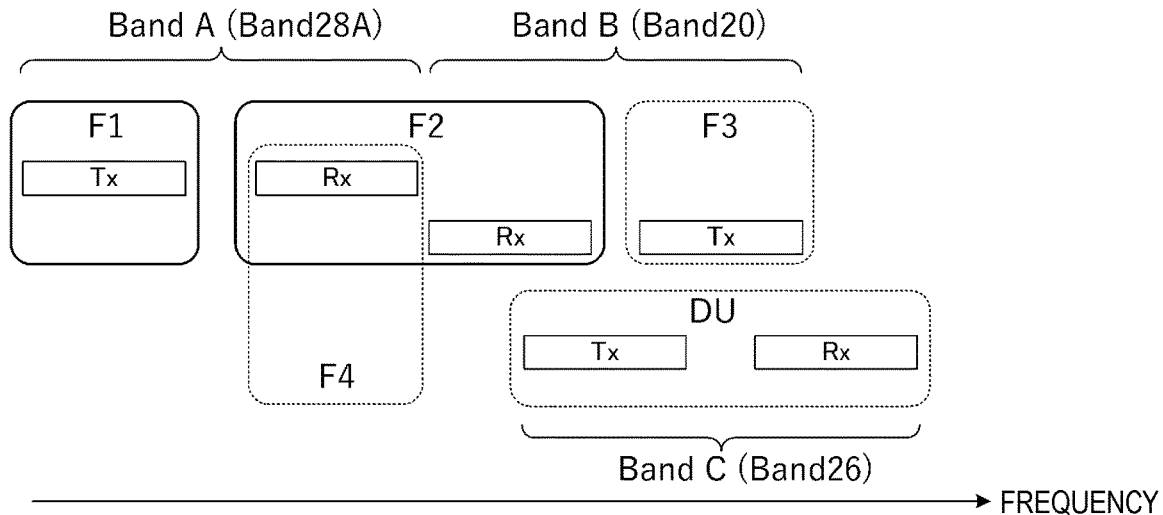
FIG. 1 is a diagram illustrating the relationship between frequency bands, to which a frontend circuit according to an embodiment of the present disclosure is applied.

FIG. 1 is a diagram illustrating the relationship between frequency bands, to which a frontend circuit according to an embodiment of the present disclosure is applied. In FIG. 1, Band A corresponds to a first communication frequency band according to the embodiments of the present disclosure, and Band B corresponds to a second communication frequency band according to the embodiments of the present disclosure. Band C corresponds to a third communication frequency band according to the embodiments of the present disclosure. The third communication frequency band will be described in an example described below. In each communication frequency band, Tx indicates its transmit frequency band, and Rx indicates its receive frequency band.

Band A, Band B, and Band C described above correspond to Band28A, Band20, and Band26, respectively, among the frequency bands defined in E-UTRA (LTE).

Figure 29:
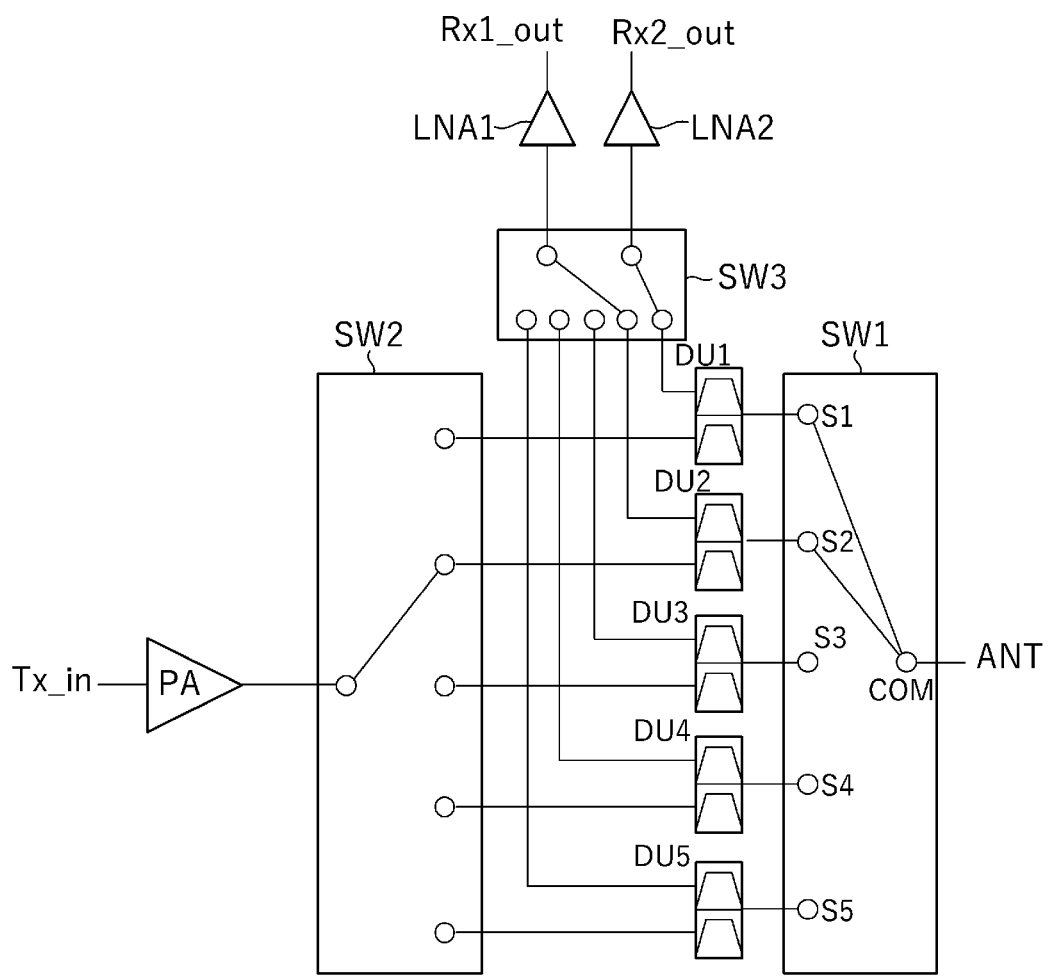
FIG. 29 is a block diagram illustrating a frontend circuit serving as a comparison example of the present disclosure.

FIG. 29 is a block diagram illustrating a frontend circuit serving as a comparison example of the present disclosure. FIG. 29 does not illustrate a configuration of the related art. The frontend circuit includes a switch SW1, duplexers DU1 to DU5, switches SW2 and SW3, a power amplifier circuit PA, and low-noise amplifier circuits LNA1 and LNA2. The switch SW1 has a common terminal to which an antenna ANT is connected. The duplexers DU1 to DU5 are connected to the corresponding individual terminals of the switch SW1. The switches SW2 and SW3 are connected to the duplexers DU1 to DU5. The power amplifier circuit PA amplifies the power of a transmit signal Tx_in. The low-noise amplifier circuits LNA1 and LNA2 amplify output signals from the switch SW3 to output receive signals Rx1_out and Rx2_out.

Figure 30:
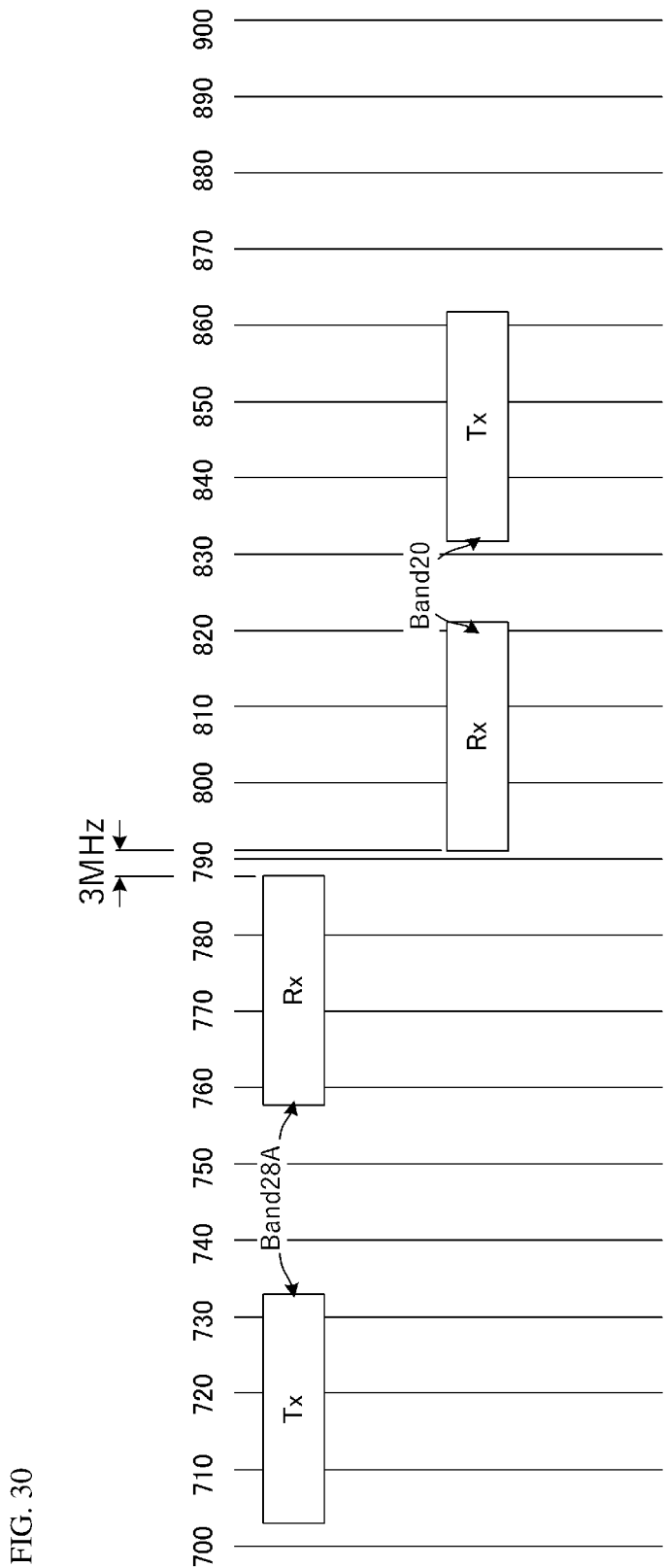
FIG. 30 is a diagram illustrating the transmit frequency band and the receive frequency band of each of two contiguous communication frequency bands, Band20 and Band28A.

FIG. 30 illustrates the transmit (uplink) frequency band Tx and the receive (downlink) frequency band Rx of each of two contiguous communication frequency bands, Band28A and Band20.

The duplexer DU1 illustrated in FIG. 29 separates a transmit signal from a receive signal of Band28A. The duplexer DU2 separates a transmit signal from a receive signal of Band20. Thus, in two-downlink one-uplink carrier aggregation using the receive frequency band of Band28A, the receive frequency band of Band20, and the transmit frequency band of Band20, the switches SW1, SW2, and SW3 are selected as illustrated in FIG. 29.

The receive frequency band of Band28A and the receive frequency band of Band20 are located so as to be spaced apart just by 3 MHz. Therefore, not only a receive signal in Band28A, but also a leaking receive signal in Band20 passes through the receive-signal filter unit of the duplexer DU1. Similarly, not only a receive signal in Band20, but also a leaking receive signal in Band28A passes through the receive-signal filter unit of the duplexer DU2. This state causes attenuation of receive signals due to the leakage.

According to the first embodiment, the problem described above is addressed as described below.

Figure 2:
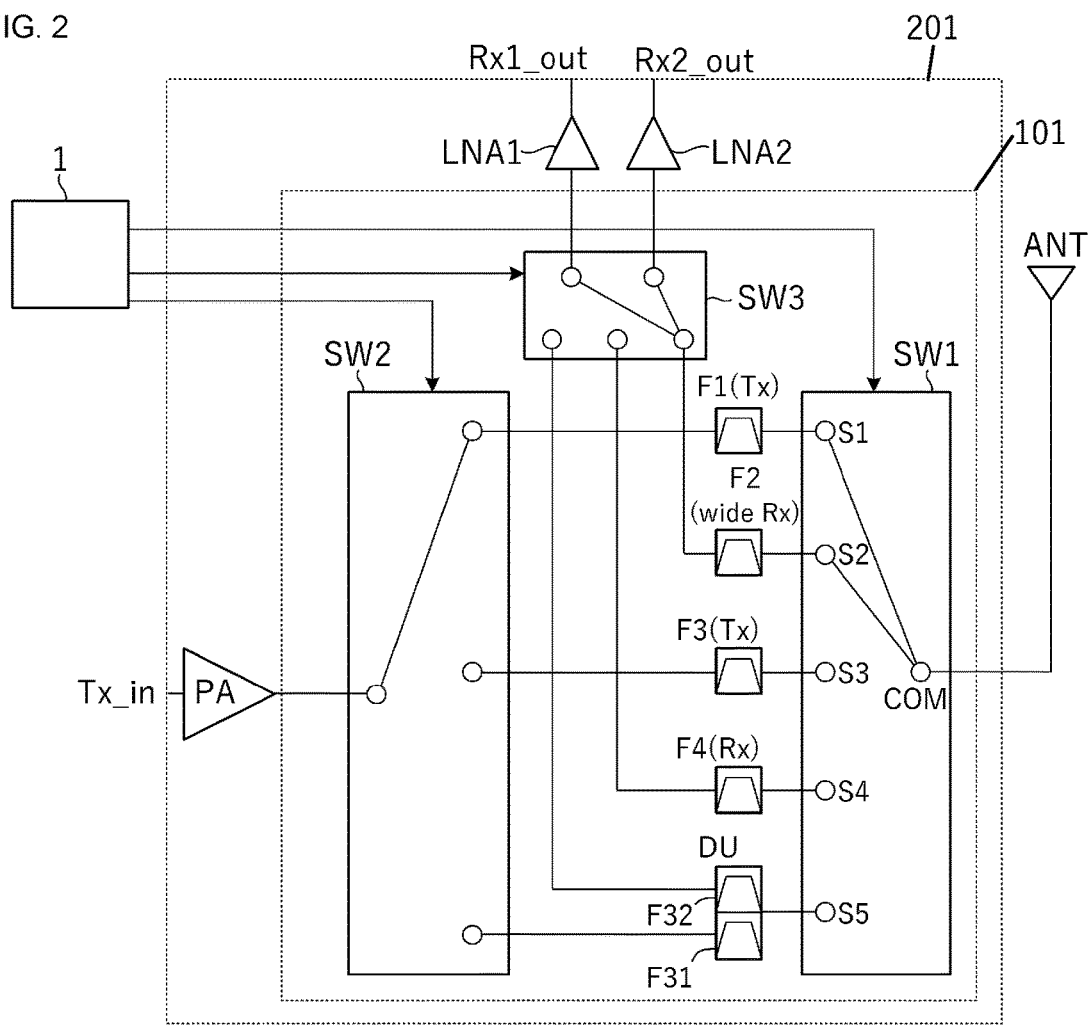
FIG. 2 is a block diagram illustrating a frontend circuit and a frontend module according to a first embodiment.

FIG. 2 is a block diagram illustrating a frontend circuit 101 and a frontend module 201 according to the first embodiment. The frontend circuit 101 is connected between a communication circuit and an antenna ANT. The communication circuit performs communication by simultaneously using multiple communication frequency bands, each of which has a transmit frequency band and a receive frequency band and has a frequency band that is close to another communication frequency band. The communication circuit is connected to the input of a power amplifier circuit PA described below and the outputs of low-noise amplifier circuits LNA1 and LNA2.

The frontend module 201 includes a switch SW1, filters F1 to F4, a duplexer DU, switches SW2 and SW3, the power amplifier circuit PA, and the low-noise amplifier circuits LNA1 and LNA2. The switch SW1 has a common terminal COM to which the antenna ANT is connected. The filters F1 to F4 are connected to the corresponding individual terminals S1 to S4 of the switch SW1. The duplexer DU is connected to an individual terminal S5 of the switch SW1. The switches SW2 and SW3 are connected to the filters F1 to F4 and the duplexer DU. The power amplifier circuit PA amplifies the power of a transmit signal Tx_in. The low-noise amplifier circuits LNA1 and LNA2 amplify output signals from the switch SW3 to output receive signals Rx1_out and Rx2_out.

In FIG. 2, each of the switches SW1, SW2, and SW3 is a direct-mapping switch. That is, the switch SW1 is capable of connecting one or more of the individual terminals S1 to S5 to the common terminal COM. The same is true for the switch SW2. The switch SW3 is capable of connecting any of the input terminals to any of the output terminals.

Assume the case in which two-downlink one-uplink carrier aggregation is performed by using the receive frequency band of the first communication frequency band, Band A, the receive frequency band of the second communication frequency band, Band B, and the transmit frequency band of the first communication frequency band, Band A, as surrounded by using the solid-line frames in FIG. 1. In this case, as illustrated in FIG. 2, a switch controller 1 determines the state of the switches SW1, SW2, and SW3. That is, the switch SW1 connects the common terminal COM to the individual terminal S1 to which the filter F1 is connected, and connects the common terminal COM to the individual terminal S2 to which the filter F2 is connected. The switch SW2 connects the common terminal, to which the output of the power amplifier circuit PA is connected, to the individual terminal to which the filter F1 is connected. The switch SW3 connects the terminals, to which the low-noise amplifier circuits LNA1 and LNA2 are connected, to the terminal to which the filter F2 is connected.

The filter F1 passes signals in the transmit frequency band of the first communication frequency band, Band A. The filter F2 passes both signals in the receive frequency band of the first communication frequency band, Band A, and signals in the receive frequency band of the second communication frequency band, Band B. The filter F2 corresponds to a "wide-band filter" according to the embodiments of the present disclosure.

Thus, the single filter F2 passes receive signals in the first communication frequency band and receive signals in the second communication frequency band.

The switch SW3 supplies an output signal from the filter F2 to the two low-noise amplifier circuits LNA1 and LNA2. The receive signals Rx1_out and Rx2_out, which are outputted from the two low-noise amplifier circuits LNA1 and LNA2, are processed as a receive signal in the first communication frequency band and a receive signal in the second communication frequency band in a receive circuit (not illustrated).

A receive signal in the first communication frequency band leaks to a receive filter of the second communication frequency band, and a receive signal in the second communication frequency band leaks to a receive filter of the first communication frequency band, for example, in a configuration having an individual receive filter, which passes receive signals in the first communication frequency band, and an individual receive filter which passes receive signals in the second communication frequency band. In contrast, the first embodiment avoids such leakage of receive signals in the first communication frequency band and receive signals in the second communication frequency band. Therefore, the attenuation due to the leakage is suppressed.

Figure 3:
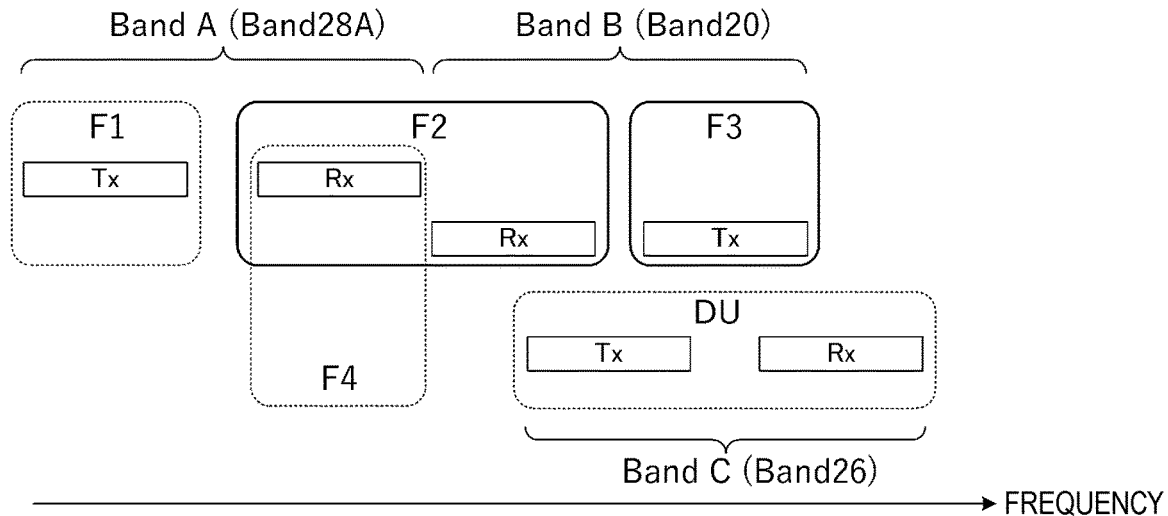
FIG. 3 is a diagram illustrating the relationship between frequency bands, to which a frontend circuit according to an embodiment of the present disclosure is applied.

FIG. 3 is a diagram illustrating the relationship between the frequency bands, to which a frontend circuit according to an embodiment of the present disclosure is applied. The relationship between the frequency bands is the same as that in the example in FIG. 1. The example described next is two-downlink one-uplink carrier aggregation using the receive frequency band of the first communication frequency band, Band A, the receive frequency band of the second communication frequency band, Band B, and the transmit frequency band of the second communication frequency band, Band B, as surrounded by using the solid-line frames in FIG. 3.

Figure 4:
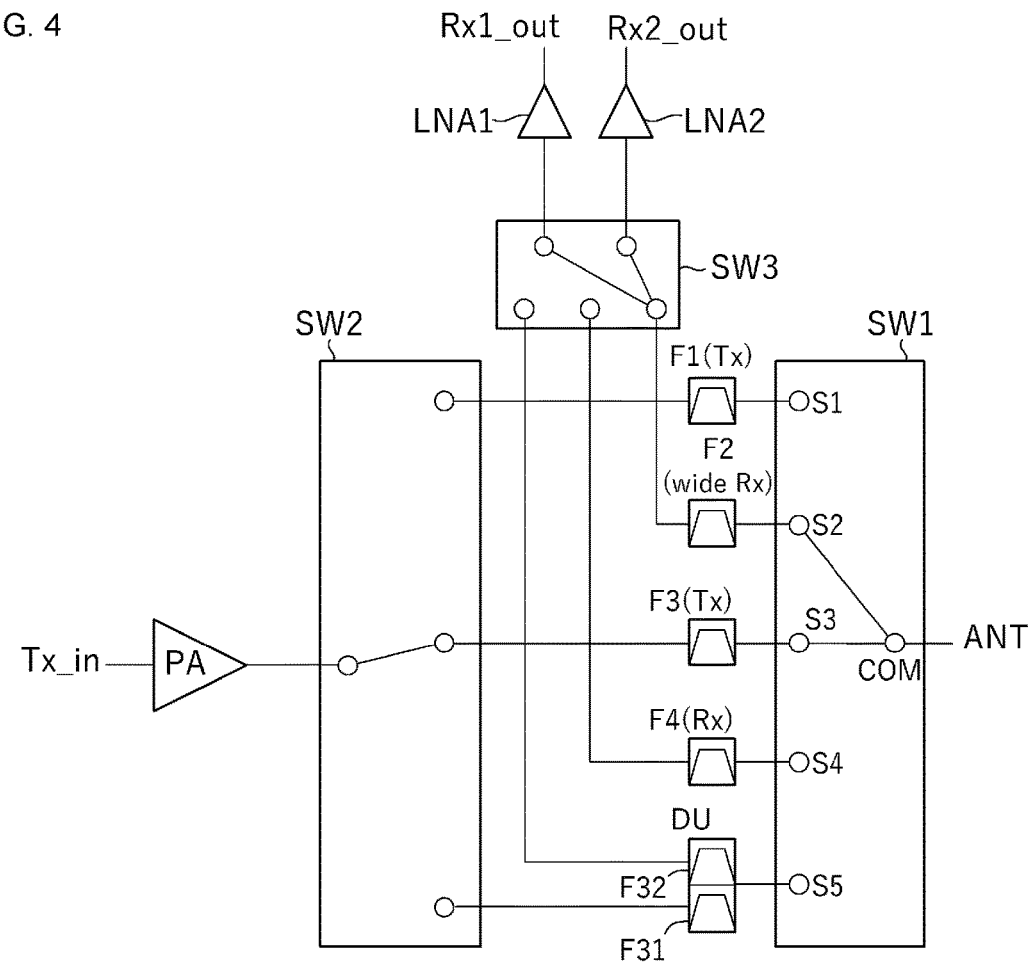
FIG. 4 is a diagram illustrating the state of switches in the carrier aggregation illustrated in FIG. 3.

FIG. 4 is a diagram illustrating the state of the switches SW1, SW2, and SW3 in the carrier aggregation in FIG. 3. The switch SW1 connects the common terminal COM to the individual terminal S2, to which the filter F2 is connected, and connects the common terminal COM to the individual terminal S3 to which the filter F3 is connected. The switch SW2 connects the common terminal, to which the output of the power amplifier circuit PA is connected, to the individual terminal to which the filter F3 is connected. The switch SW3 connects the terminals, to which the low-noise amplifier circuits LNA1 and LNA2 are connected, to the terminal to which the filter F2 is connected.

This state causes a receive signal in the first communication frequency band and a receive signal in the second communication frequency band to pass through the filter F2. A transmit signal in the second communication frequency band passes through the filter F3.

Figure 5:
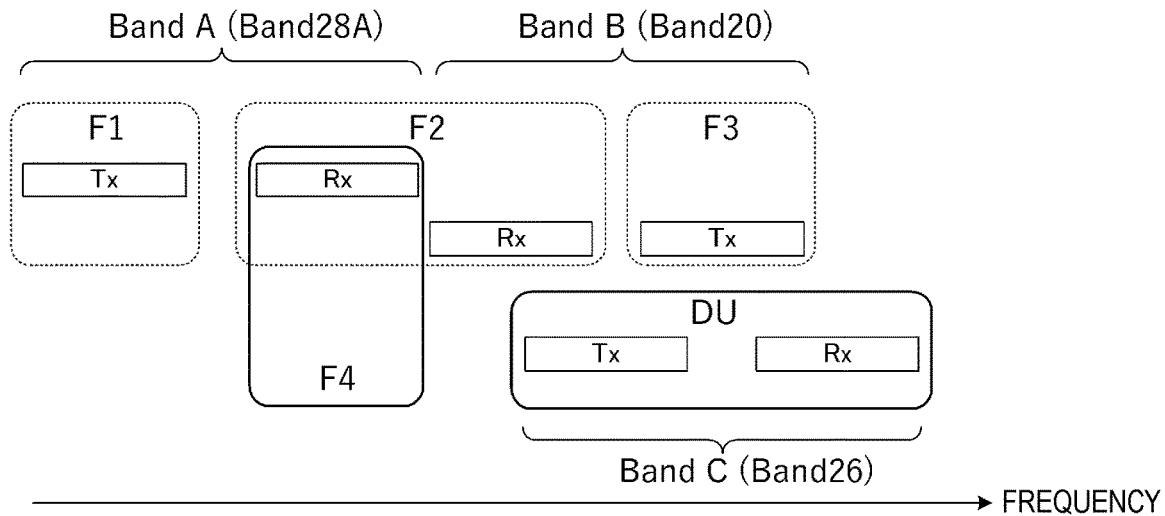
FIG. 5 is a diagram illustrating the relationship between frequency bands, to which a frontend circuit according to an embodiment of the present disclosure is applied.

FIG. 5 is a diagram illustrating the relationship between the frequency bands, to which a frontend circuit according to an embodiment of the present disclosure is applied. The relationship between the frequency bands is the same as that in the example in FIG. 1. The example described next is two-downlink one-uplink carrier aggregation using the receive frequency band of the first communication frequency band, Band A, the receive frequency band of a third communication frequency band, Band C, and the transmit frequency band of the third communication frequency band, Band C, as surrounded by using the solid-line frames in FIG. 5.

Figure 6:
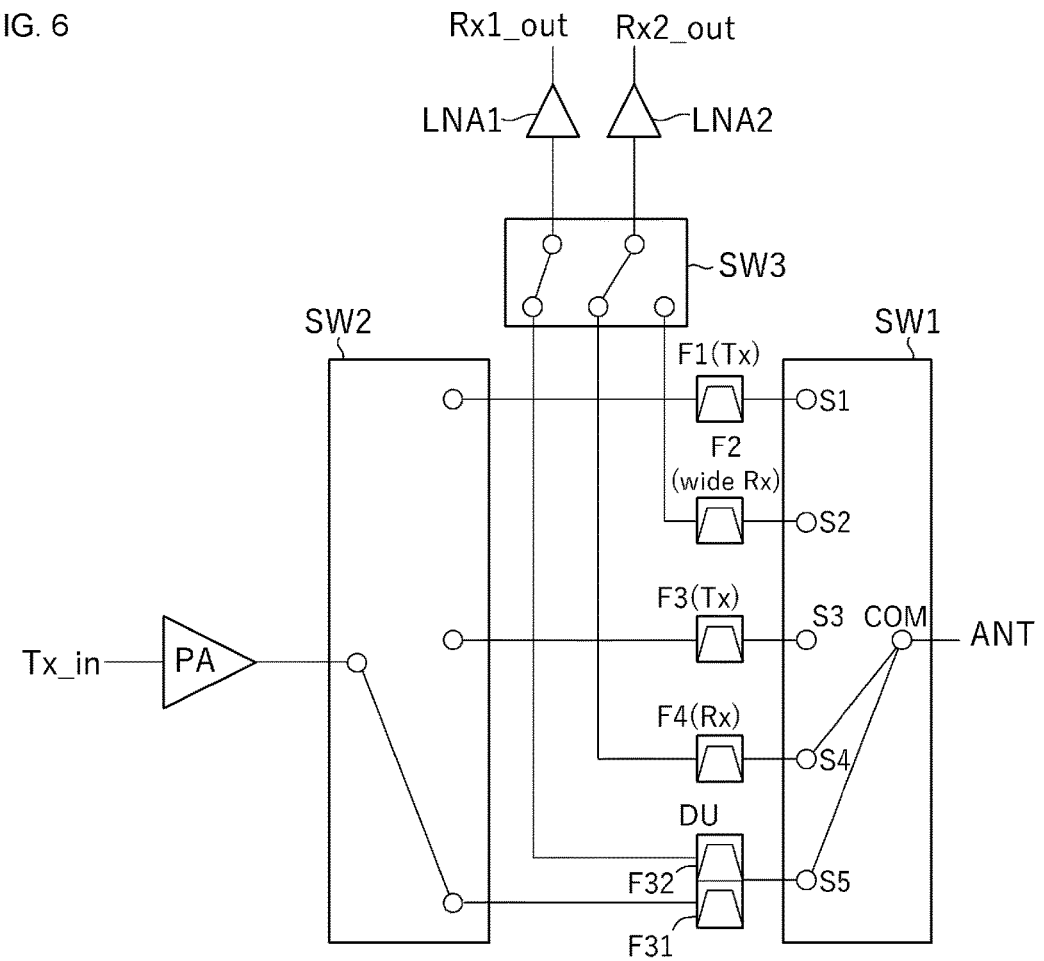
FIG. 6 is a diagram illustrating the state of switches in the carrier aggregation illustrated in FIG. 5.

FIG. 6 is a diagram illustrating the state of the switches SW1, SW2, and SW3 in the carrier aggregation illustrated in FIG. 5. This state causes a receive signal in the first communication frequency band to pass through the filter F4, and causes a receive signal in the third communication frequency band to pass through a receive filter F32 of the duplexer DU. A transmit signal in the third communication frequency band passes through a transmit filter F31 of the duplexer DU. A receive signal in the first communication frequency band and a receive signal in the third communication frequency band are amplified by the low-noise amplifier circuits LNA1 and LNA2, respectively.

As illustrated in FIGS. 5 and 6, assume the case of two-downlink one-uplink carrier aggregation using the receive frequency band of the first communication frequency band, Band A, the receive frequency band of the third communication frequency band, Band C, and the transmit frequency band of the third communication frequency band, Band C. In this case, instead of the wide-band filter F2, the filter F4, which passes the receive frequency band of the first communication frequency band, is selected as a filter through which a receive signal in the first communication frequency band passes, resulting in avoidance of leakage of a transmit signal in the third communication frequency band through the filter F2 to a receive circuit of the first communication frequency band. In addition, a receive signal in the first communication frequency band passes through the filter F4 having a band narrower than that of the wide-band filter F2, resulting in further suppression of insertion loss of the filter.

Figure 7:
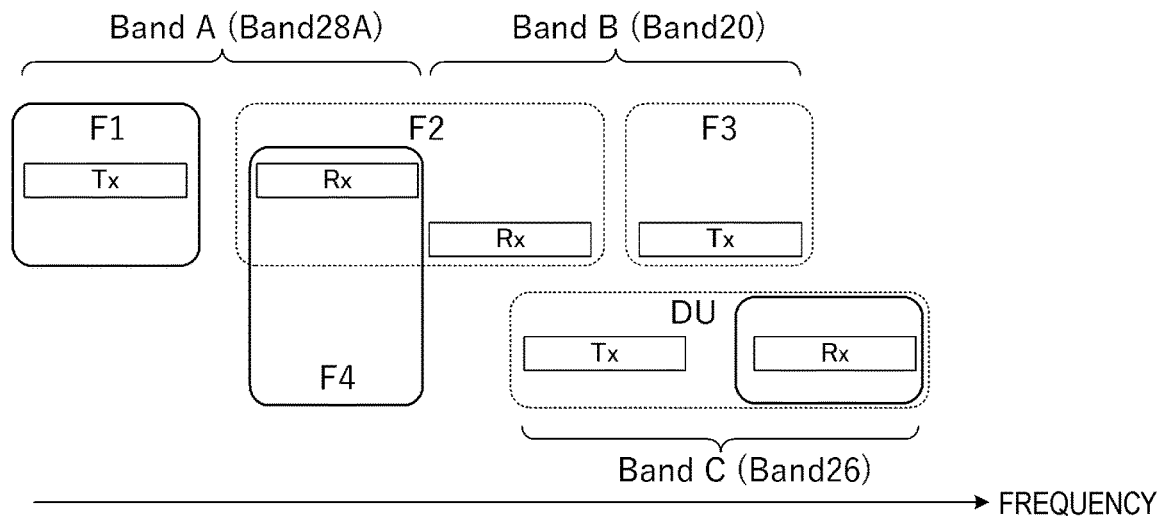
FIG. 7 is a diagram illustrating the relationship between frequency bands, to which a frontend circuit according to an embodiment of the present disclosure is applied.

FIG. 7 is a diagram illustrating the relationship between the frequency bands, to which a frontend circuit according to an embodiment of the present disclosure is applied. The relationship between the frequency bands is the same as that in the example in FIG. 1. The example described next is two-downlink one-uplink carrier aggregation using the transmit frequency band of the first communication frequency band, Band A, the receive frequency band of the first communication frequency band, Band A, and the receive frequency band of the third communication frequency band, Band C, as surrounded by using the soli-line frames in FIG. 7.

Figure 8:
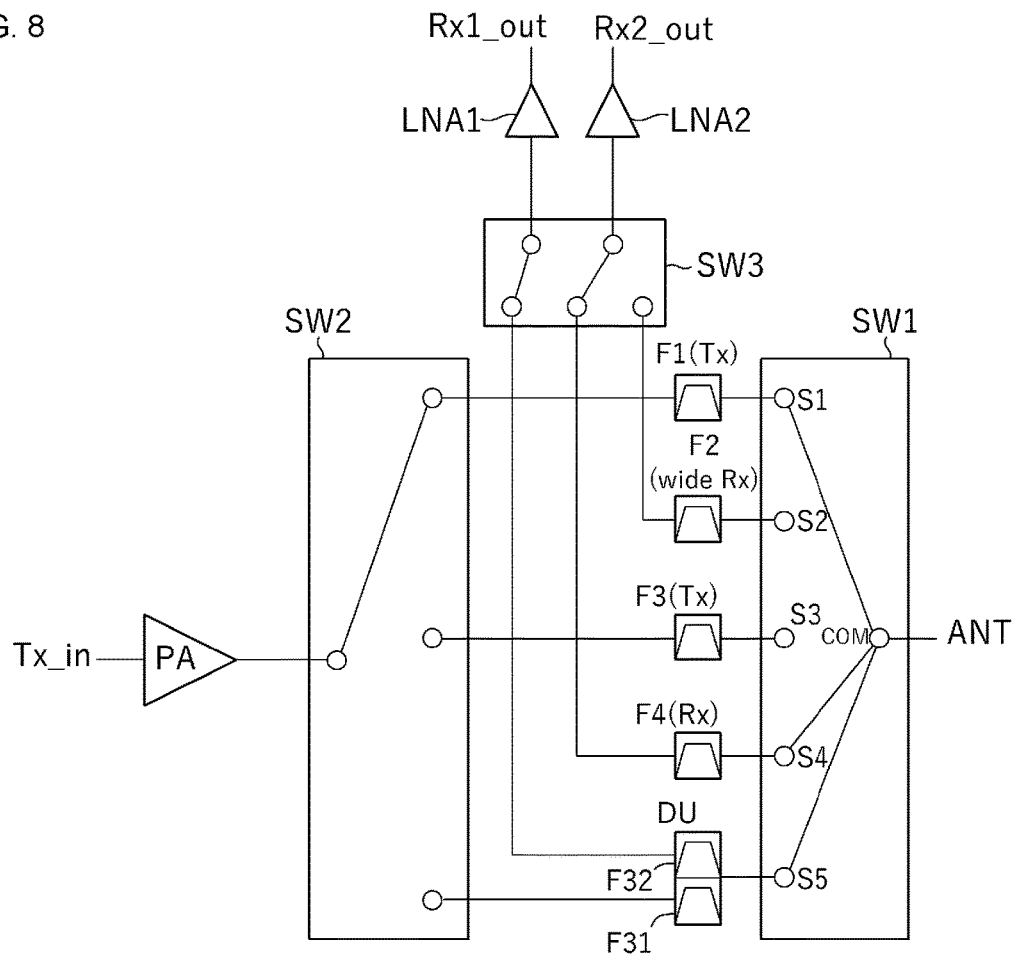
FIG. 8 is a diagram illustrating the state of switches in the carrier aggregation illustrated in FIG. 7.

FIG. 8 is a diagram illustrating the state of the switches SW1, SW2, and SW3 in the carrier aggregation illustrated in FIG. 7. The switch SW1 connects the common terminal COM to the individual terminal S1, to which the filter F1 is connected, connects the common terminal COM to the individual terminal S4, to which the filter F4 is connected, and connects the common terminal COM to the individual terminal S5 to which the duplexer DU is connected. The switch SW2 connects the common terminal, to which the output of the power amplifier circuit PA is connected, to the individual terminal to which the filter F1 is connected. The switch SW3 connects the terminal, to which the low-noise amplifier circuit LNA1 is connected, to the terminal, to which the receive filter F32 of the duplexer DU is connected, and connects the terminal, to which the low-noise amplifier circuit LNA2 is connected, to the terminal to which the filter F4 is connected.

This state causes a transmit signal in the first communication frequency band to pass through the filter F1, and causes a receive signal in the first communication frequency band to pass through the filter F4. A receive signal in the third communication frequency band passes through the receive filter F32 of the duplexer DU. A receive signal in the first communication frequency band and a receive signal in the third communication frequency band are amplified by using the low-noise amplifier circuits LNA1 and LNA2, respectively.

Figure 9:
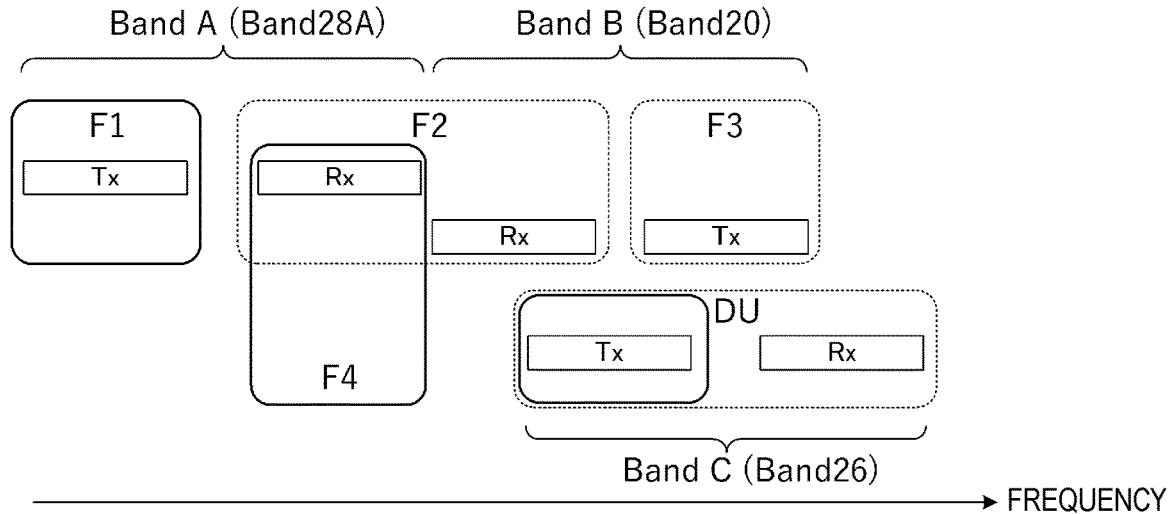
FIG. 9 is a diagram illustrating the relationship between frequency bands, to which a frontend circuit according to an embodiment of the present disclosure is applied.

FIG. 9 is a diagram illustrating the relationship between the frequency bands, to which a frontend circuit according to an embodiment of the present disclosure is applied. The relationship between the frequency bands is the same as that in the example in FIG. 1. The example described below is one-downlink two-uplink carrier aggregation using the transmit frequency band of the first communication frequency band, Band A, the receive frequency band of the first communication frequency band, Band A, and the transmit frequency band of the third communication frequency band, Band C, as surrounded by using the solid-line frames in FIG. 9.

Figure 10:
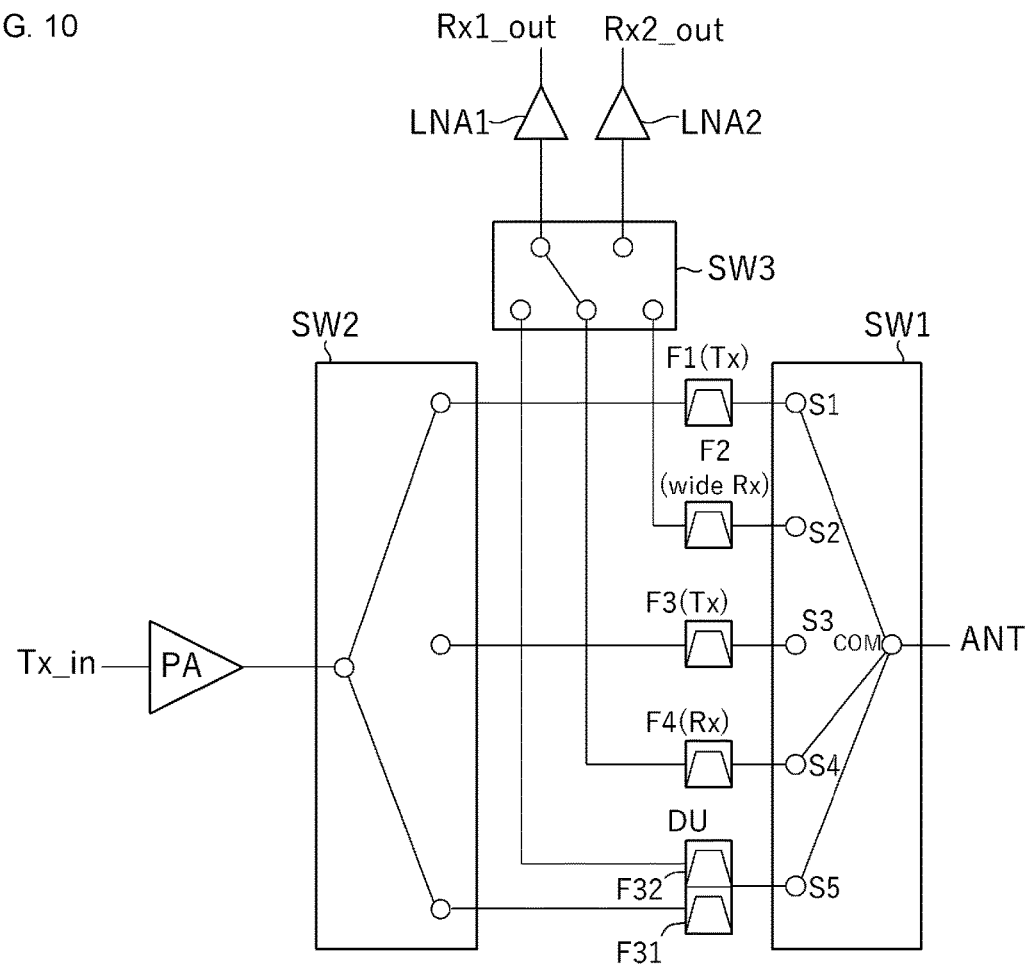
FIG. 10 is a diagram illustrating the state of switches in the carrier aggregation illustrated in FIG. 9.

FIG. 10 is a diagram illustrating the state of the switches SW1, SW2, and SW3 in the carrier aggregation illustrated in FIG. 9. The switch SW1 connects the common terminal COM to the individual terminal S1, to which the filter F1 is connected, connects the common terminal COM to the individual terminal S4, to which the filter F4 is connected, and connects the common terminal COM to the individual terminal S5 to which the duplexer DU is connected. The switch SW2 connects the individual terminal, to which the filter F1 is connected, to the common terminal, to which the output of the power amplifier circuit PA is connected, and connects the individual terminal, to which the transmit filter F31 of the duplexer DU is connected, to the common terminal. The switch SW3 connects the terminal, to which the low-noise amplifier circuit LNA1 is connected, to the terminal to which the filter F4 is connected.

This state causes a transmit signal in the first communication frequency band to pass through the filter F1, and causes a receive signal in the first communication frequency band to pass through the filter F4. A transmit signal in the third communication frequency band passes through the transmit filter F31 of the duplexer DU. A receive signal in the first communication frequency band is amplified by using the low-noise amplifier circuit LNA1.

FIGS. 5, 7, and 9 illustrate examples in which the receive frequency band of the second communication frequency band, Band B, overlaps the transmit frequency band of the third communication frequency band, Band C. Even in the case where the low band of the third communication frequency band, Band C, serves as the receive frequency band, and where the high band serves as the transmit frequency band, any setting may be made as long as a receive signal in the first communication frequency band, Band A, passes through the filter F4. Thus, receive signals in the receive frequency bands, which are not close to each other, pass through individual receive filters, achieving avoidance of the leakage of receive signals.

A configuration of a part for separating an output signal from a low-noise amplifier circuit into receive signals in two receive frequency bands will be described.

Figure 11:
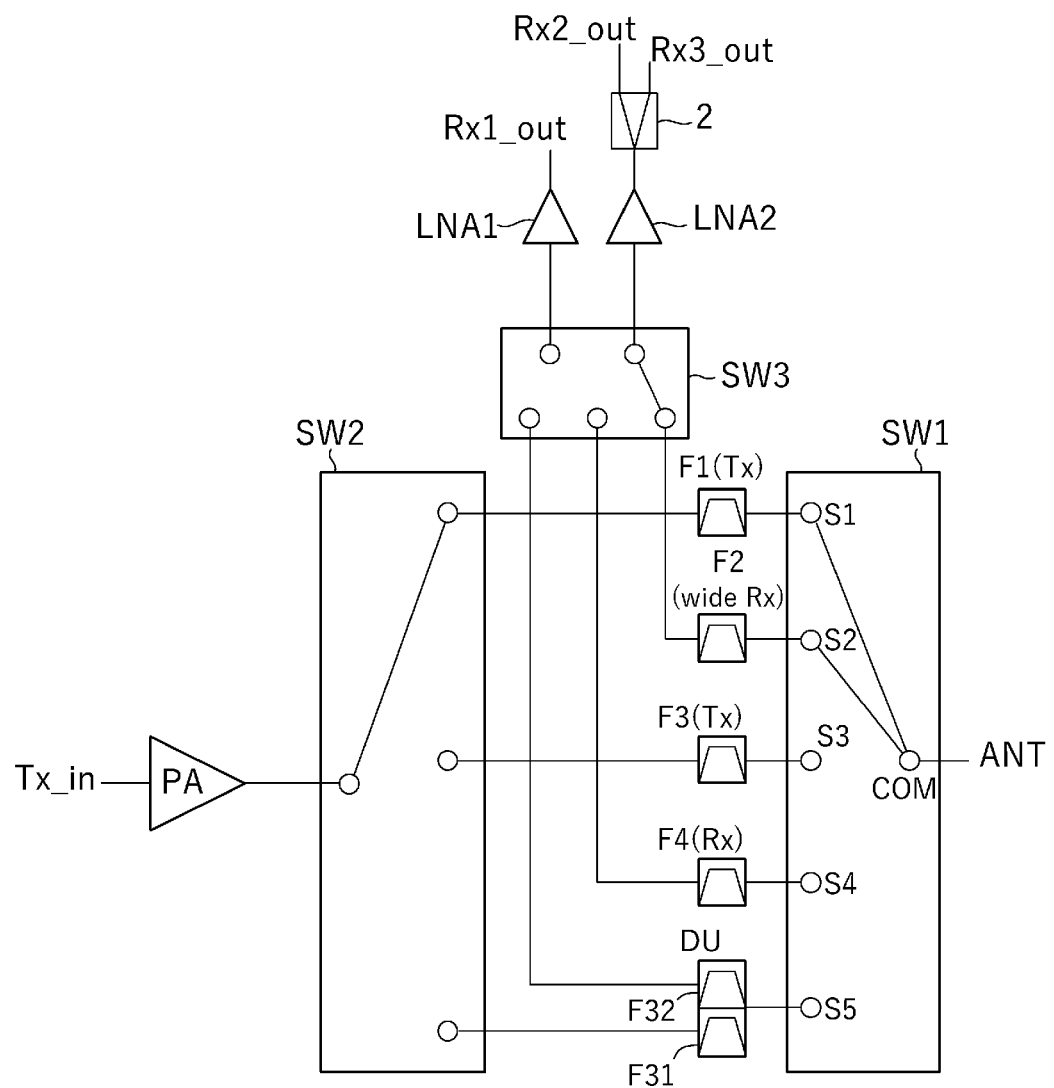
FIG. 11 is a block diagram illustrating a frontend module circuit according to an embodiment of the present disclosure.

FIG. 11 is a block diagram illustrating a frontend module according to the first embodiment. A distribution circuit 2 is disposed at the output of the low-noise amplifier circuit LNA2. The other configuration is the same as that in FIG. 2. The state of the switches SW1, SW2, and SW3 in FIG. 11 is substantially the same as that in the example in FIG. 2.

Figure 12:
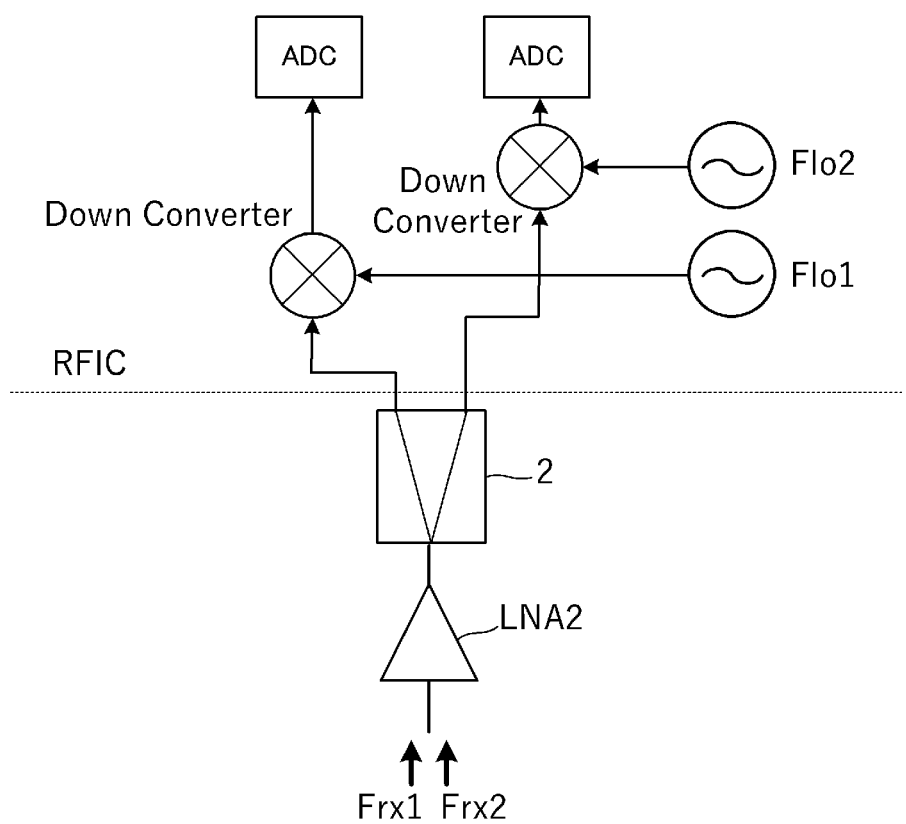
FIG. 12 is a block diagram illustrating a signal processing circuit for output signals from a distribution circuit illustrated in FIG. 11.
Figure 13:
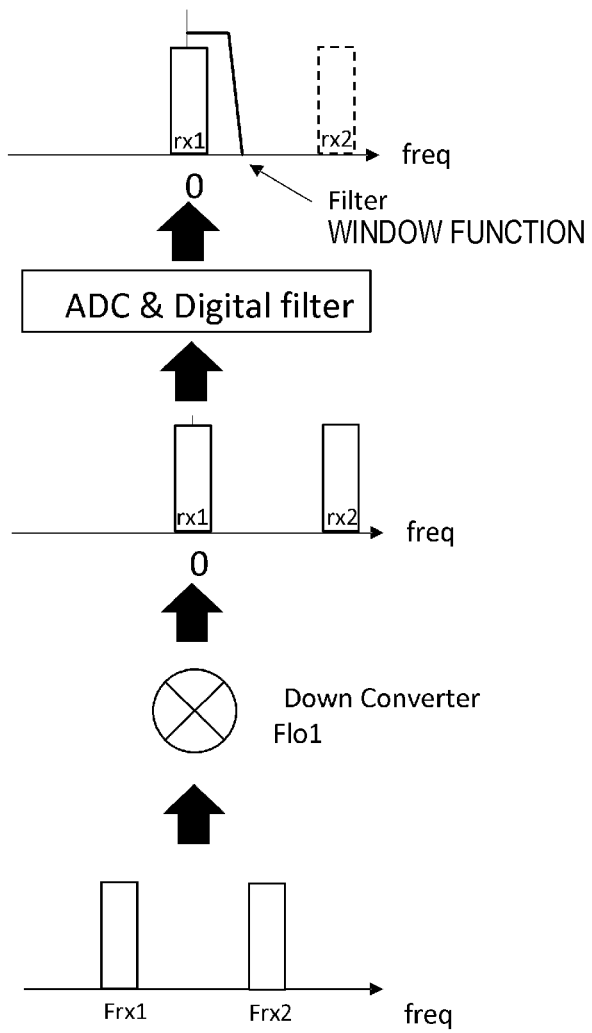
FIG. 13 is a block diagram illustrating the processes performed until receive data is obtained from a receive signal received by a low-noise amplifier circuit.

FIG. 12 is a block diagram illustrating a signal processing circuit for output signals from the distribution circuit 2 in FIG. 11. FIG. 13 is a block diagram illustrating the processes performed until receive data is obtained from a receive signal received by the low-noise amplifier circuit LNA2.

As illustrated in FIG. 12, a receive signal, in which a receive signal Frx1 in the first communication frequency band is mixed with a receive signal Frx2 in the second communication frequency band, is amplified by the low-noise amplifier circuit LNA2. The amplified receive signal is subjected to frequency conversion by two down-converters and local signal generators Flo1 and Flo2. The frequency-converted receive signals are subjected to AD conversion. The data is separated, through digital-filter processing of multiplication using a window function, into data about a receive signal in the first communication frequency band and data about a receive signal in the second communication frequency band.

The series of processes are performed in a radio frequency integrated circuit (RFIC).

Thus, even when a receive signal in the first communication frequency band is mixed with a receive signal in the second communication frequency band in the analog-signal stage, signals in the two receive frequency bands may be extracted through frequency conversion and digital filtering.

Second Embodiment

A second embodiment describes an example of carrier aggregation using four communication frequency bands.

Figure 14:
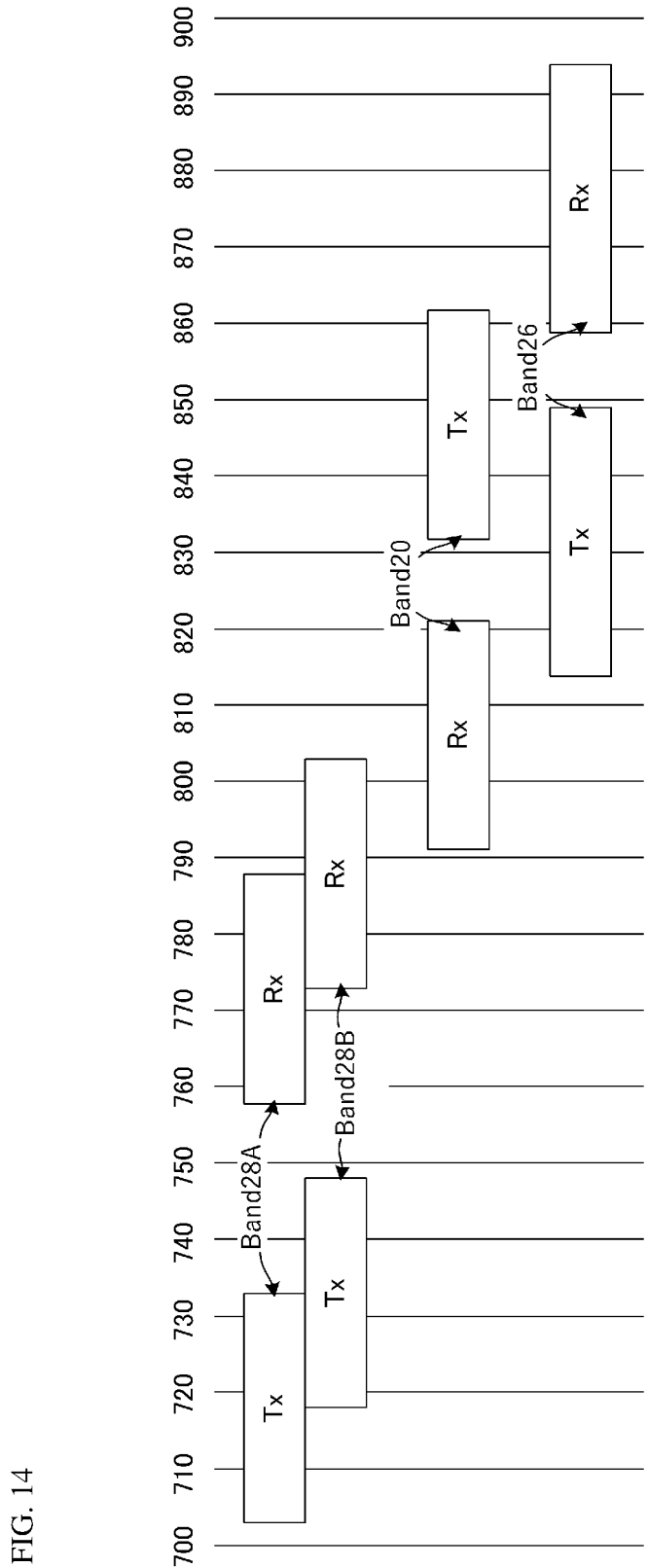
FIG. 14 is a diagram illustrating the relationship between Band28A, Band28B, Band20, and Band26 among the frequency bands defined in the Evolved Universal Terrestrial Radio Access (E-UTRA) or long term evolution (LTE)

FIG. 14 is a diagram illustrating the relationship between Band28A, Band28B, Band20, and Band26 among the frequency bands defined in E-UTRA (LTE). The values indicate frequencies [MHz].

Figure 15:
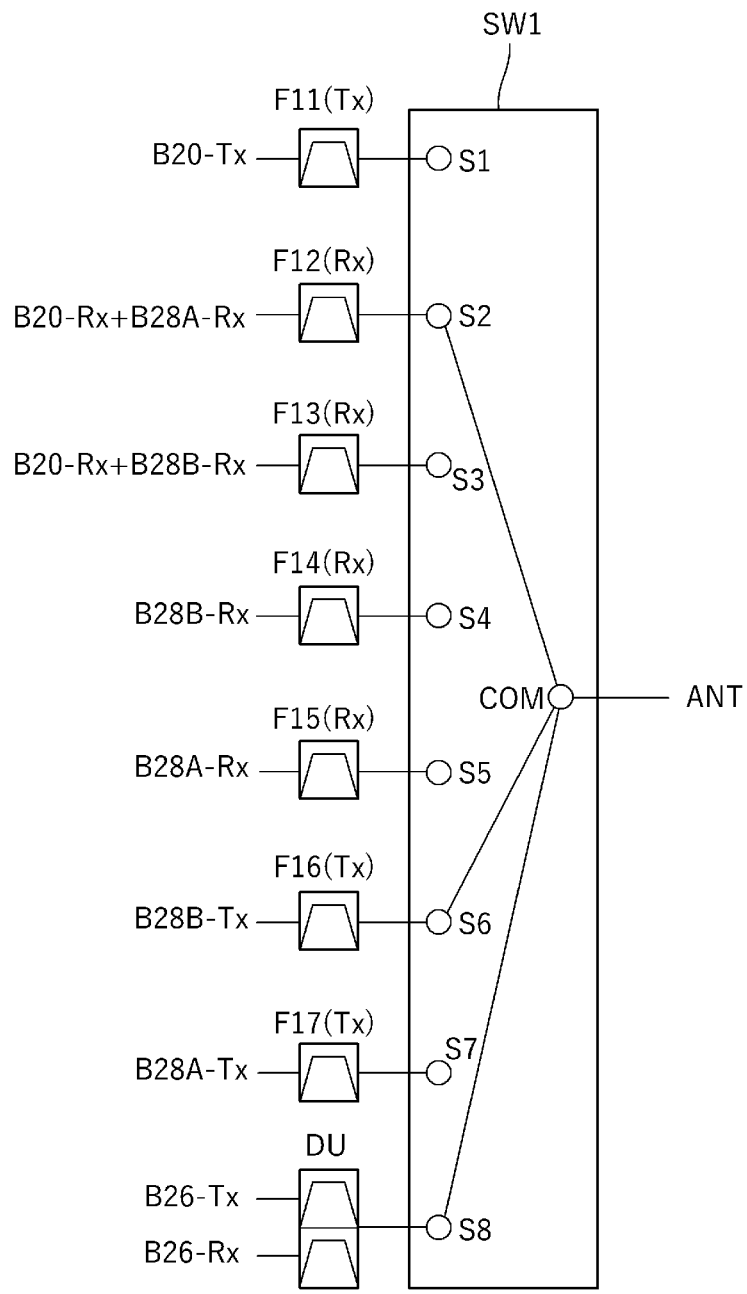
FIG. 15 is a diagram illustrating the state of a switch in a frontend circuit according to a second embodiment.

FIG. 15 is a diagram illustrating the state of a switch SW1 in a frontend circuit. In FIG. 15, a filter F11 is a filter through which transmit signals in the transmit frequency band of Band20 pass. A filter F12 is a wide-band filter through which receive signals in the receive frequency band of Band20 and receive signals in the receive frequency band of Band28A pass. A filter F13 is a wide-band filter through which receive signals in the receive frequency band of Band20 and receive signals in the receive frequency band of Band28B pass. A filter F14 is a filter through which receive signals in Band28B pass. A filter F15 is a filter through which receive signals in Band28A pass. A filter F16 is a filter through which transmit signals in Band28B pass. A filter F17 is a filter through which transmit signals in Band28A pass. A duplexer DU is a filter through which transmit signals and receive signals in Band26 pass. The configuration other than that in FIG. 15 is illustrated in FIG. 2 or the like.

For example, in two-downlink two-uplink carrier aggregation using the receive frequency band of Band20, the receive frequency band of Band28A, the transmit frequency band of Band28B, and the transmit frequency band of Band26, the switch SW1 is set as illustrated in FIG. 15. That is, the switch SW1 connects a common terminal COM to an individual terminal S2, to which the filter F12 is connected, connects the common terminal COM to an individual terminal S6, to which the filter F16 is connected, and connects the common terminal COM to an individual terminal S8 to which the duplexer DU is connected.

Thus, four or more communication frequency bands may be used. In addition, uplink carrier aggregation may be also performed.

Third Embodiment

A third embodiment describes an example of communication using multiple communication frequency bands, which are contiguous to or overlap others, and an example of use of the same filter both in a single use of a communication frequency band and in carrier aggregation.

Figure 16:
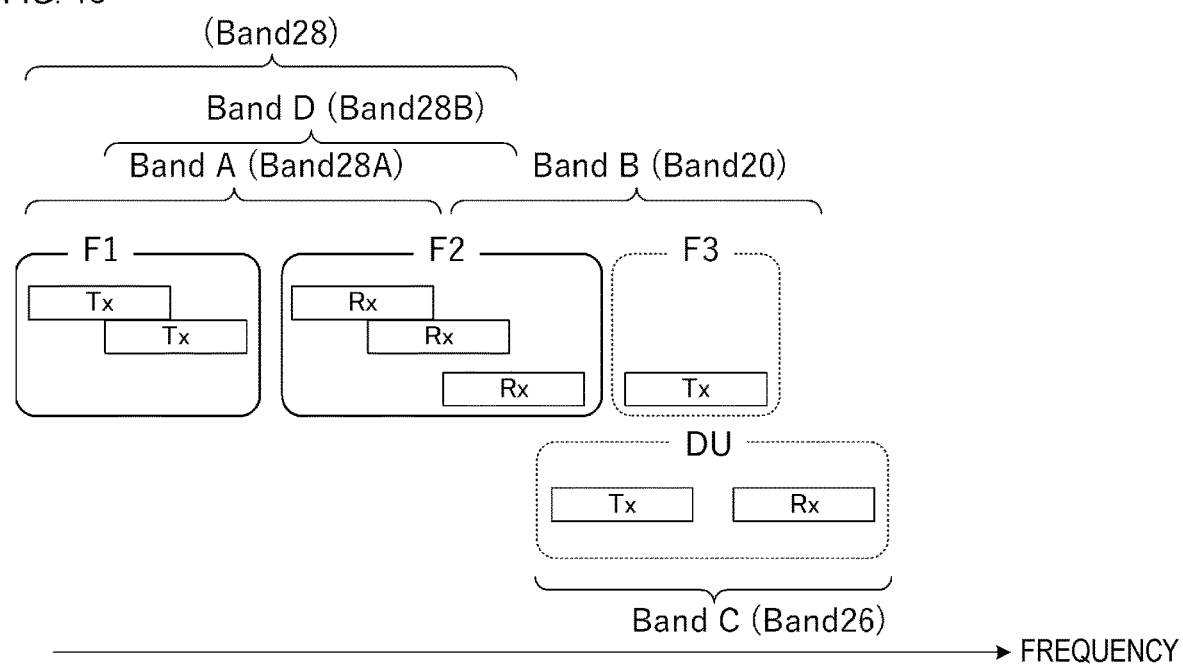
FIG. 16 is a diagram illustrating the relationship between frequency bands, to which a frontend circuit according to a third embodiment is applied.

FIG. 16 is a diagram illustrating the relationship between the frequency bands, to which a frontend circuit according to the third embodiment is applied. In FIG. 16, Band A, Band B, Band C, and Band D correspond to Band28A, Band20, Band 26, and Band28B, respectively, among the frequency bands defined in E-UTRA (LTE). In each communication frequency band, Tx indicates its transmit frequency band, and Rx indicates its receive frequency band.

Figure 17:
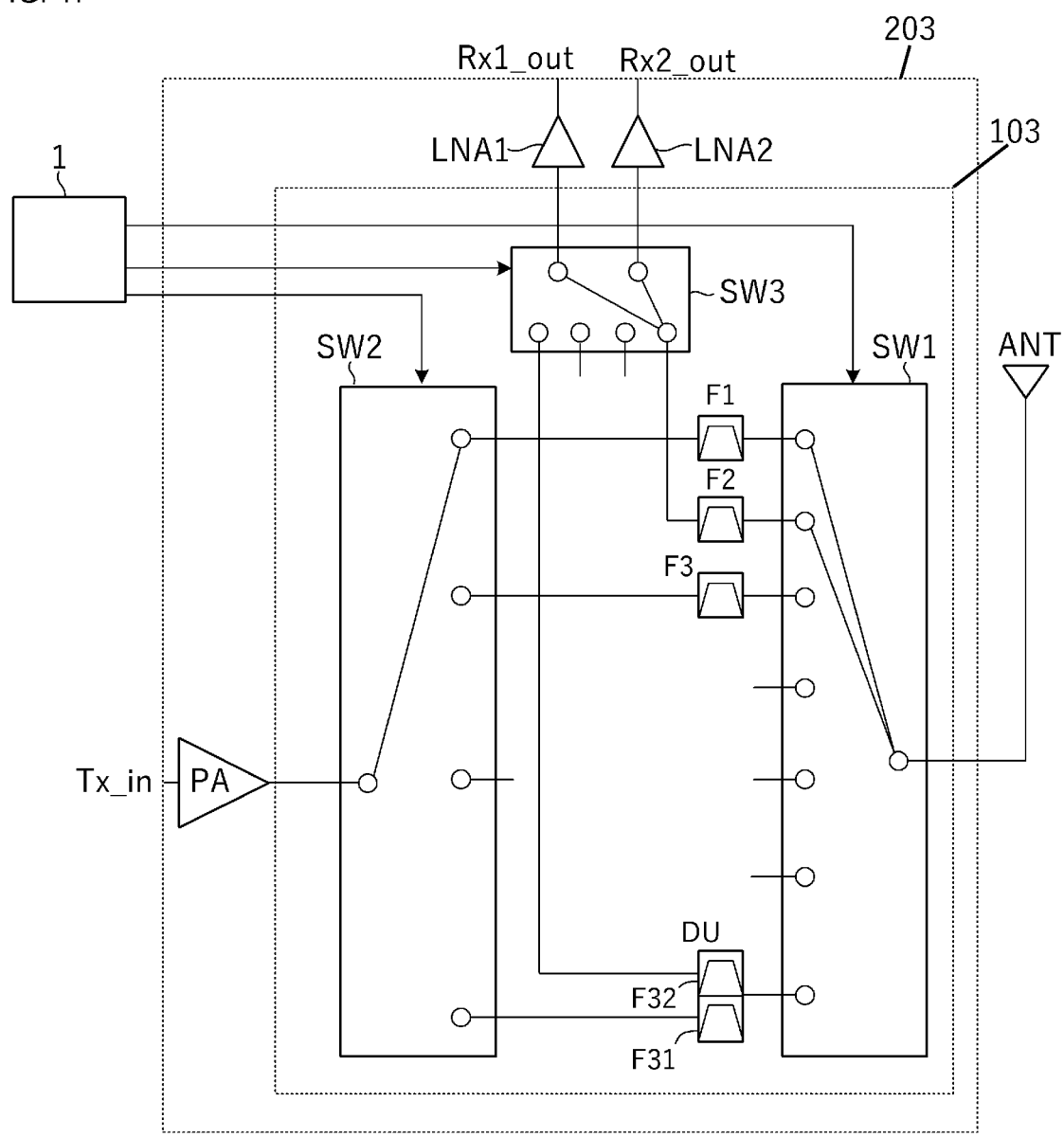
FIG. 17 is a block diagram illustrating a frontend circuit and a frontend module according to the third embodiment.

FIG. 17 is a block diagram illustrating a frontend circuit 103 and a frontend module 203 according to the third embodiment. The frontend circuit 103 is connected between a communication circuit and an antenna ANT. The communication circuit performs communication by simultaneously using multiple communication frequency bands, each of which has a transmit frequency band and a receive frequency band and has a frequency band that is close to another communication frequency band. The communication circuit is connected to the input of a power amplifier circuit PA described below and the outputs of low-noise amplifier circuits LNA1 and LNA2.

The frontend module 203 includes a switch SW1, filters F1 to F3 and a duplexer DU, a switch SW2, a switch SW3, the power amplifier circuit PA, and the low-noise amplifier circuits LNA1 and LNA2. The switch SW1 has a common terminal connected to the antenna ANT. The filters F1 to F3 and the duplexer DU are connected to individual terminals of the switch SW1. The switch SW2 is connected to the filters F1 and F3 and the duplexer DU. The switch SW3 is connected to the filter F2 and the duplexer DU. The power amplifier circuit PA amplifies the power of a transmit signal Tx_in. The low-noise amplifier circuits LNA1 and LNA2 amplify output signals from the switch SW3 to output receive signals Rx1_out and Rx2_out.

For example, in two-downlink one-uplink carrier aggregation using the receive frequency band of Band A, the receive frequency band of Band B, and the transmit frequency band of Band A, as illustrated in FIG. 17, a switch controller 1 determines the state of the switches SW1, SW2, and SW3. That is, the switch SW1 connects the common terminal to the individual terminal, to which the filter F1 is connected, and connects the common terminal to the individual terminal to which the filter F2 is connected. The switch SW2 connects a common terminal, to which the output of the power amplifier circuit PA is connected, to the individual terminal to which the filter F1 is connected. The switch SW3 connects the terminals, to which the low-noise amplifier circuits LNA1 and LNA2 are connected, to the terminal to which the filter F2 is connected.

Even in the single mode in which the receive frequency band of Band A and the transmit frequency band of Band A are used individually, as illustrated in FIG. 17, the switch controller 1 determines the state of the switches SW1, SW2, and SW3.

Even in the single mode in which the receive frequency band of Band D and the transmit frequency band of Band D are used individually, as illustrated in FIG. 17, the switch controller 1 determines the state of the switches SW1, SW2, and SW3.

Thus, the wide-band filter F2, which is used in carrier aggregation, is used also in the single mode. This eliminates necessity of having a transmit filter and a receive filter for Band A and a transmit filter and a receive filter for Band D individually, achieving an advantage in terms of a reduction in size and cost.

Fourth Embodiment

A fourth embodiment describes an example of a frontend circuit which performs carrier aggregation using a first communication frequency band and a second communication frequency band or carrier aggregation using the first communication frequency band or the second communication frequency band, and a third communication frequency band.

FIGS. 18A to 18D are diagrams illustrating the relationships between frequency bands, to which a frontend circuit according to the fourth embodiment is applied. In FIGS. 18A to 18D, Band A, Band B, and Band E correspond to Band28A, Band20, and Band8 among the frequency bands defined in E-UTRA (LTE). In each communication frequency band, Tx indicates its transmit frequency band, and Rx indicates its receive frequency band. In FIGS. 18A to 18D, frequency bands which are used are surrounded by using the solid-line frames. The example in FIG. 18A indicates the state in two-downlink one-uplink carrier aggregation using the transmit frequency band of Band A, the receive frequency band of Band A, and the receive frequency band of Band B. The example in FIG. 18B indicates the state in two-downlink one-uplink carrier aggregation using the transmit frequency band of Band B, the receive frequency band of Band B, and the receive frequency band of Band A. The example in FIG. 18C indicates the state in two-downlink one-uplink carrier aggregation using the transmit frequency band of Band A, the receive frequency band of Band A, and the receive frequency band of Band E. The example in FIG. 18D indicates the state in two-downlink one-uplink carrier aggregation using the transmit frequency band of Band B, the receive frequency band of Band B, and the receive frequency band of Band E.

FIGS. 19 to 22 are block diagrams illustrating a frontend circuit 104 and a frontend module 204 according to the fourth embodiment. The frontend circuit 104 is connected between an antenna ANT and a communication circuit. The communication circuit performs communication by simultaneously using multiple communication frequency bands, each of which has a transmit frequency band and a receive frequency band and has a frequency band that is close to another communication frequency band. The communication circuit is connected to the input of a power amplifier circuit PA described below and the outputs of low-noise amplifier circuits LNA1 and LNA2.

The frontend module 204 includes a switch SW1, filters F1, F2, F3, F5, and F6, a switch SW2, a switch SW3, the power amplifier circuit PA, and the low-noise amplifier circuits LNA1 and LNA2. The switch SW1 has a common terminal connected to the antenna ANT. The filters F1, F2, F3, F5, and F6 are connected to individual terminals of the switch SW1. The switch SW2 is connected to the filters F1, F3, and F5. The switch SW3 is connected to the filters F2 and F6. The power amplifier circuit PA amplifies the power of a transmit signal Tx_in. The low-noise amplifier circuits LNA1 and LNA2 amplify output signals from the switch SW3 to output receive signals Rx1_out and Rx2_out.

Figure 18A:
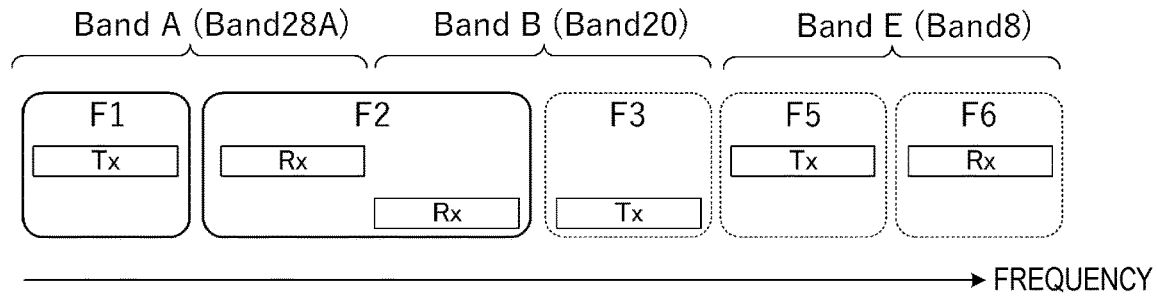
FIGS. 18A to 18D are diagrams illustrating the relationships between frequency bands, to which a frontend circuit according to a fourth embodiment is applied.
Figure 19:
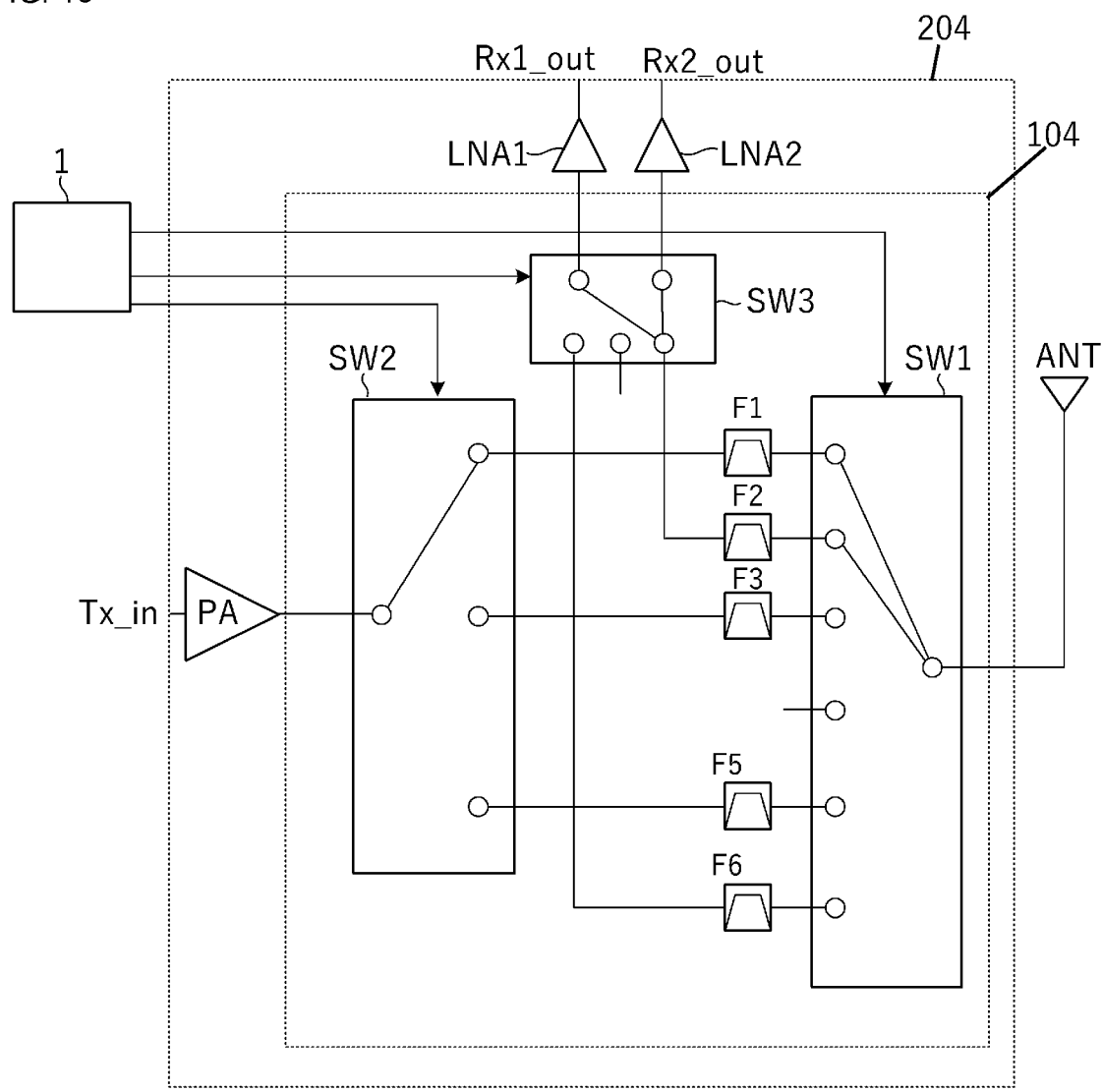
FIG. 19 is a block diagram illustrating a frontend circuit and a frontend module according to the fourth embodiment.

As illustrated in FIG. 18A, in two-downlink one-uplink carrier aggregation using the transmit frequency band of Band A, the receive frequency band of Band A, and the receive frequency band of Band B, as illustrated in FIG. 19, a switch controller 1 exerts control to create the following state: the switch SW1 selects the filters F1 and F2; the switch SW2 selects the filter F1; and the switch SW3 selects the filter F2.

Figure 18B:
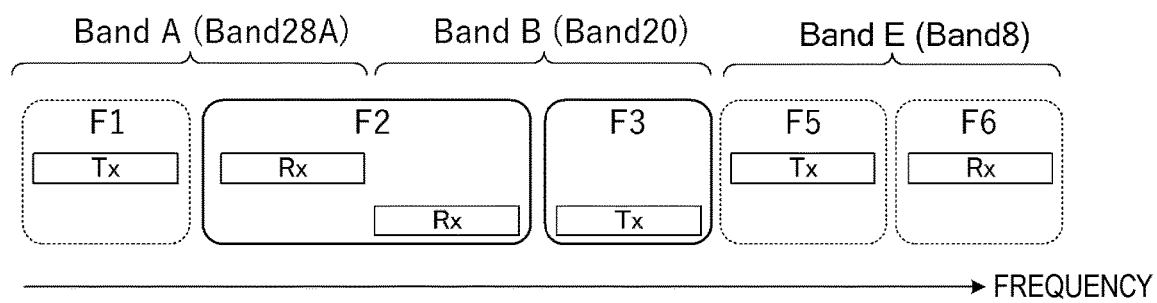
Figure 20:
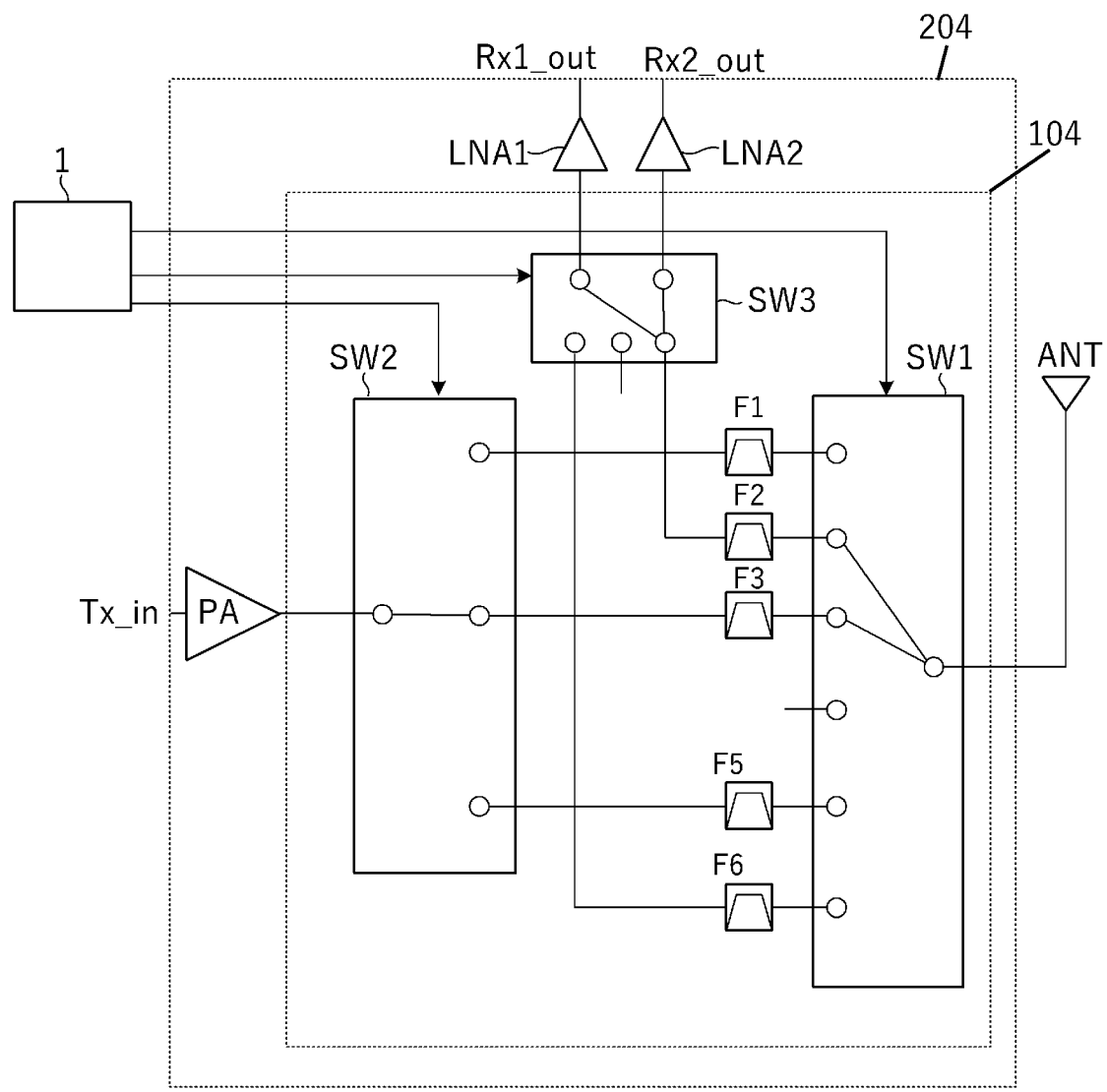
FIG. 20 is a block diagram illustrating a frontend circuit and a frontend module according to the fourth embodiment.

As illustrated in FIG. 18B, in two-downlink one-uplink carrier aggregation using the transmit frequency band of Band B, the receive frequency band of Band B, and the receive frequency band of Band A, as illustrated in FIG. 20, the switch controller 1 exerts control to create the following state: the switch SW1 selects the filters F2 and F3; the switch SW2 selects the filter F3; and the switch SW3 selects the filter F2.

Figure 18C:
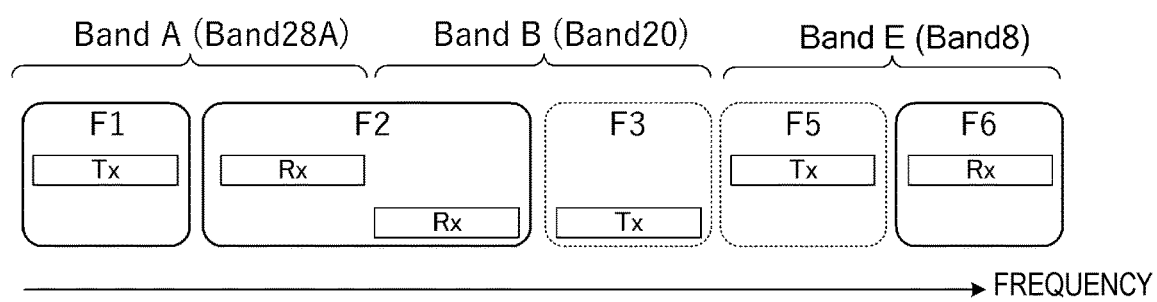
Figure 21:
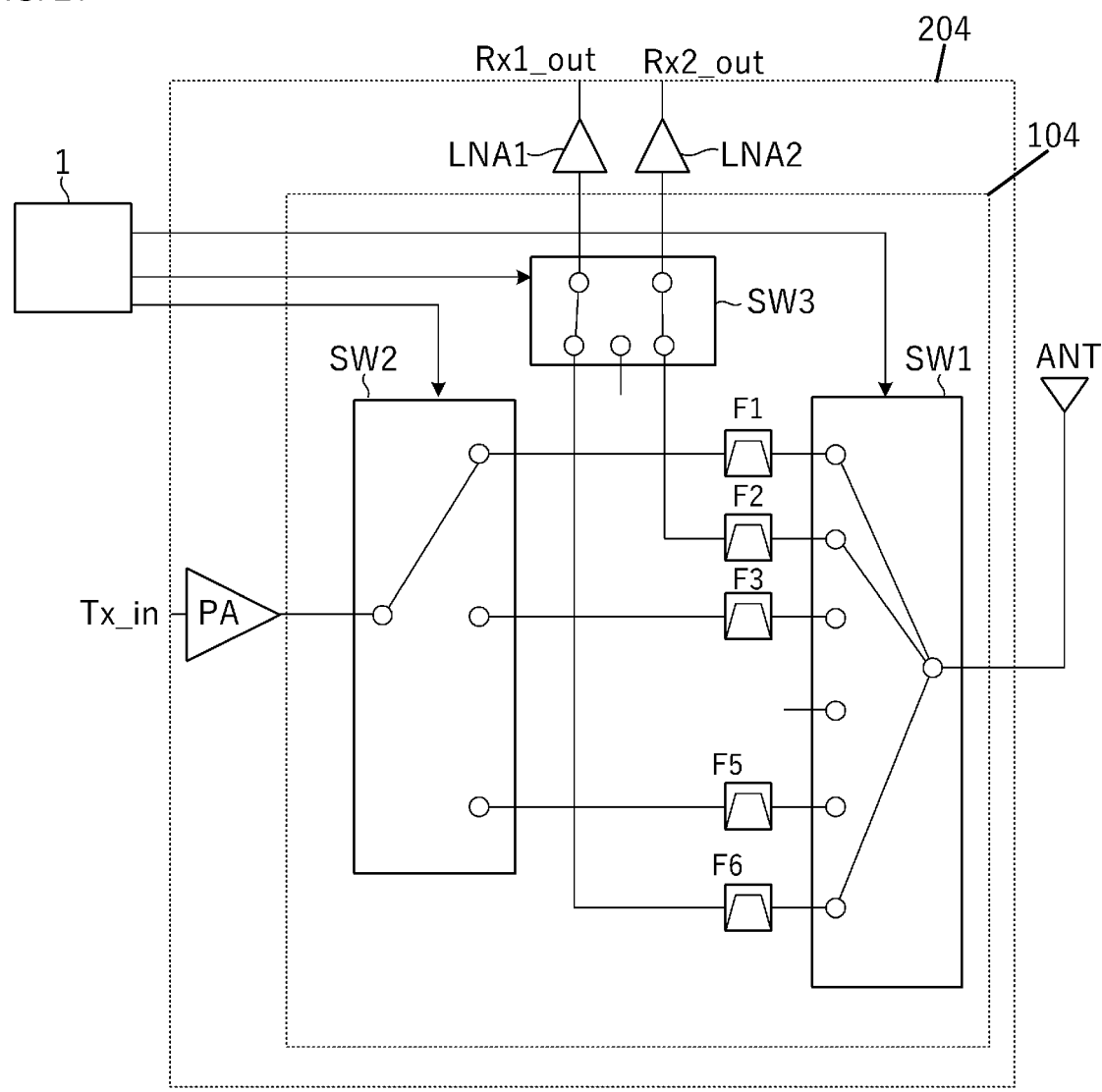
FIG. 21 is a block diagram illustrating a frontend circuit and a frontend module according to the fourth embodiment.

As illustrated in FIG. 18C, in two-downlink one-uplink carrier aggregation using the transmit frequency band of Band A, the receive frequency band of Band A, and the receive frequency band of Band E, as illustrated in FIG. 21, the switch controller 1 exerts control to create the following state; the switch SW1 selects the filters F1, F2, and F6; the switch SW2 selects the filter F1; and the switch SW3 selects the filter F2 and the filter F6.

Figure 18D:
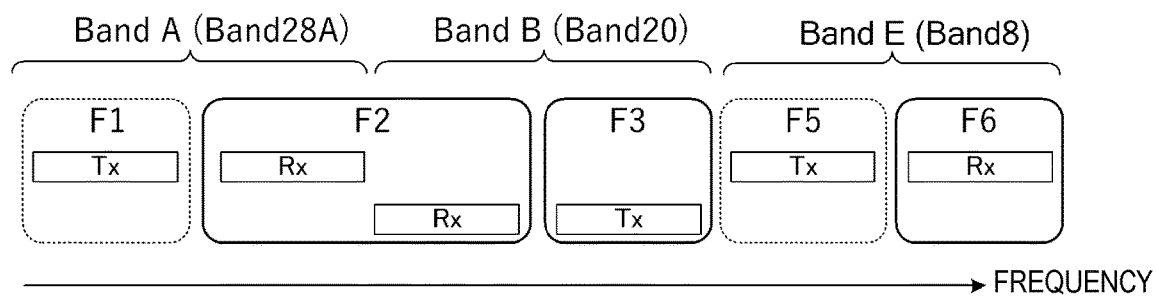
Figure 22:
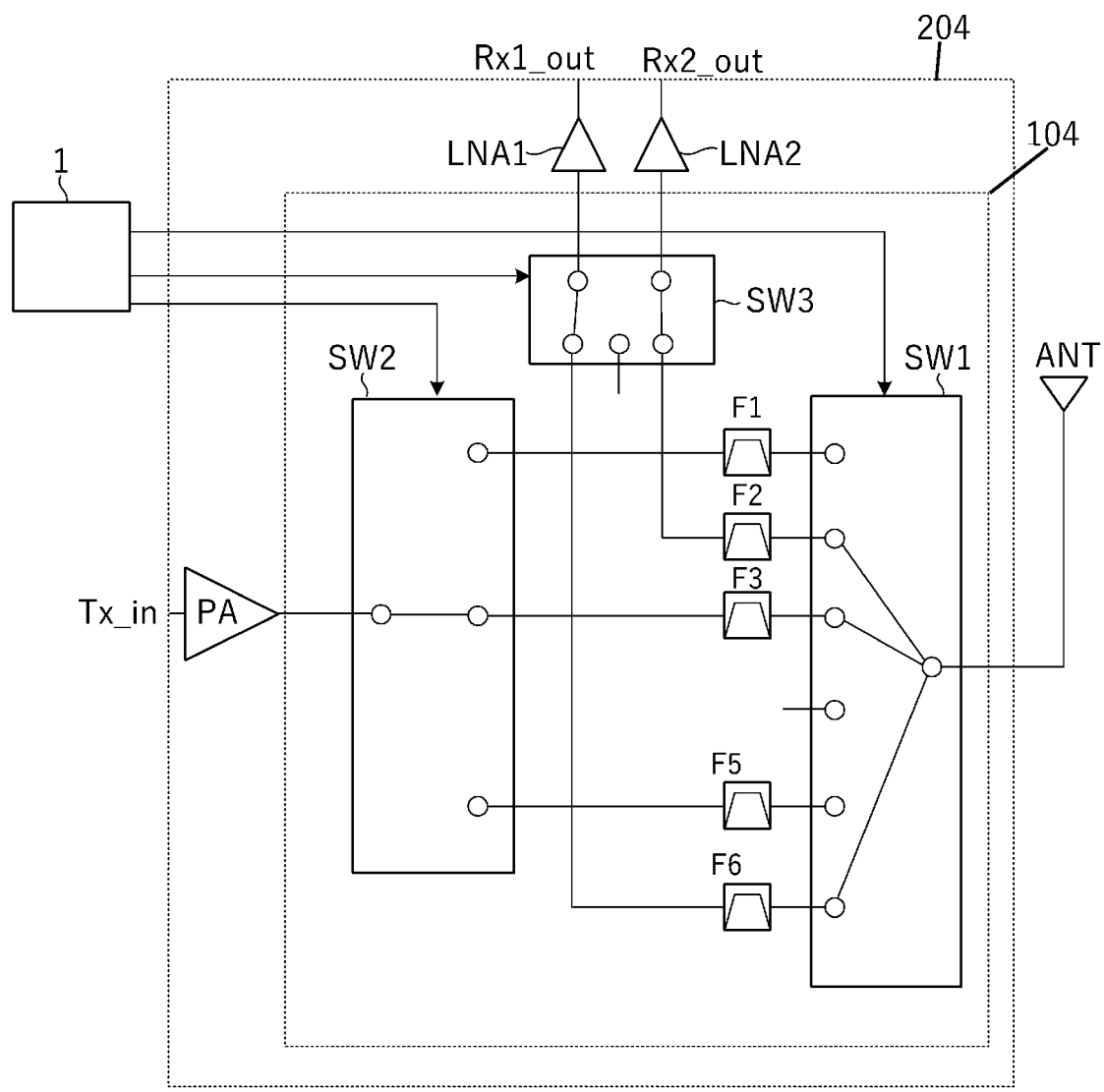
FIG. 22 is a block diagram illustrating a frontend circuit and a frontend module according to the fourth embodiment.

As illustrated in FIG. 18D, in two-downlink one-uplink carrier aggregation using the transmit frequency band of Band B, the receive frequency band of Band B, and the receive frequency band of Band E, as illustrated in FIG. 22, the switch controller 1 exerts control to create the following state; the switch SW1 selects the filters F2, F3, and F6; the switch SW2 selects the filter F3; and the switch SW3 selects the filter F2 and the filter F6.

In the fourth embodiment, the wide-band filter F2, which is used in carrier aggregation using the receive frequency band of Band A and the receive frequency band of Band B, is used also in carrier aggregation using the receive frequency band of Band A and the receive frequency band of Band E. In addition, similarly, the wide-band filter F2 is used also in carrier aggregation using the receive frequency band of Band B and the receive frequency band of Band E. This eliminates necessity of having a receive filter for Band A and a receive filter for Band B individually, achieving an advantage in terms of a reduction in size and cost.

Fifth Embodiment

A fifth embodiment describes an exemplary frontend circuit including a multiplexer having multiple transmit-signal input ports and receive-signal output ports.

Figure 23:
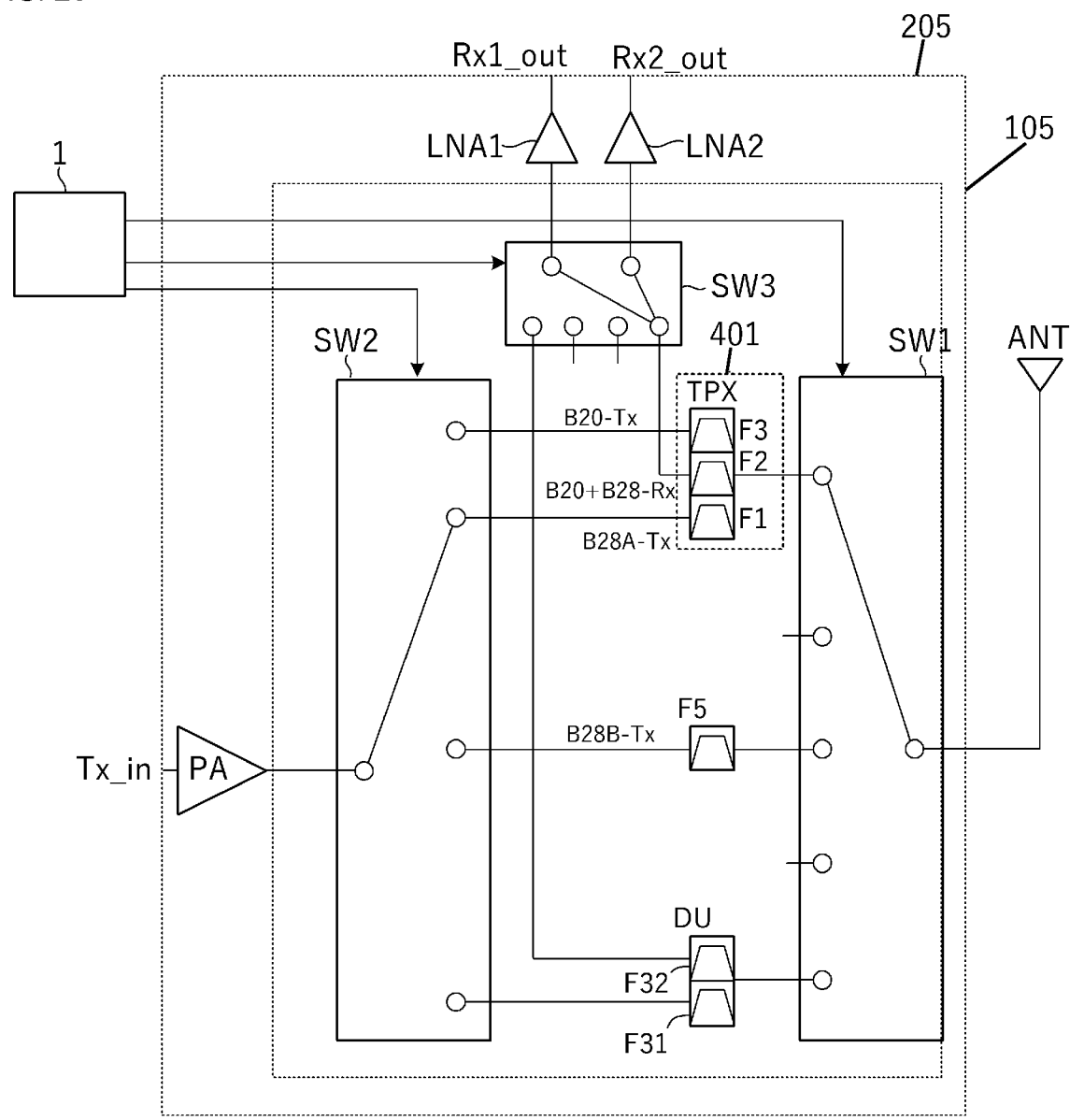
FIG. 23 is a block diagram illustrating a frontend circuit and a frontend module according to a fifth embodiment.

FIG. 23 is a block diagram illustrating a frontend circuit 105 and a frontend module 205 having a triplexer 401, according to the fifth embodiment. The frontend circuit 105 is connected between a communication circuit and an antenna ANT. A switch SW1 has individual terminals connected to the triplexer 401, a filter F5, and a duplexer DU.

The triplexer 401 has three input/output ports, three filters F1, F2, and F3, and a common input/output port. The filter F1 of the triplexer 401, which has an input port for transmit signals in Band28A, passes the transmit frequency band of Band28A. The filter F3 of the triplexer 401, which has an input port for transmit signals in Band20, passes the transmit frequency band of the Band20. The filter F2 of the triplexer 401, which has an output port for receive signals in Band20, Band28A, and Band28B, passes the receive frequency band of Band20 and the receive frequency bands in Band28A and Band28B. The filter F2 corresponds to a "wide-band filter" according to the embodiments of the present disclosure.

The filter F5 passes the transmit frequency band of Band28B. A transmit filter F31 of the duplexer DU passes the transmit frequency band of Band26. A receive filter F32 passes the receive frequency band of Band26.

The triplexer 401 uses receive signals passing through the filter F2 in carrier aggregation using Band20 and Band28. The triplexer 401 uses receive signals passing through the filter F2 also in a single use of Band20, Band28A, or Band28B.

The example described above uses a triplexer handling two transmit frequency bands and two receive frequency bands. Alternatively, a multiplexer having four or more input/output ports may be used. The present disclosure may be applied similarly to, instead of a multiplexer handling transmit signals and receive signals, a multiplexer handling only transmit signals or a multiplexer handling only receive signals. The triplexer 401 according to the fifth embodiment corresponds to a "multiplexer" according to the embodiments of the present disclosure.

The example in FIG. 23 achieves a reduction in the number of filters, serving as surface mounted components, and a further reduction in the size of the apparatus.

Sixth Embodiment

Figure 24:
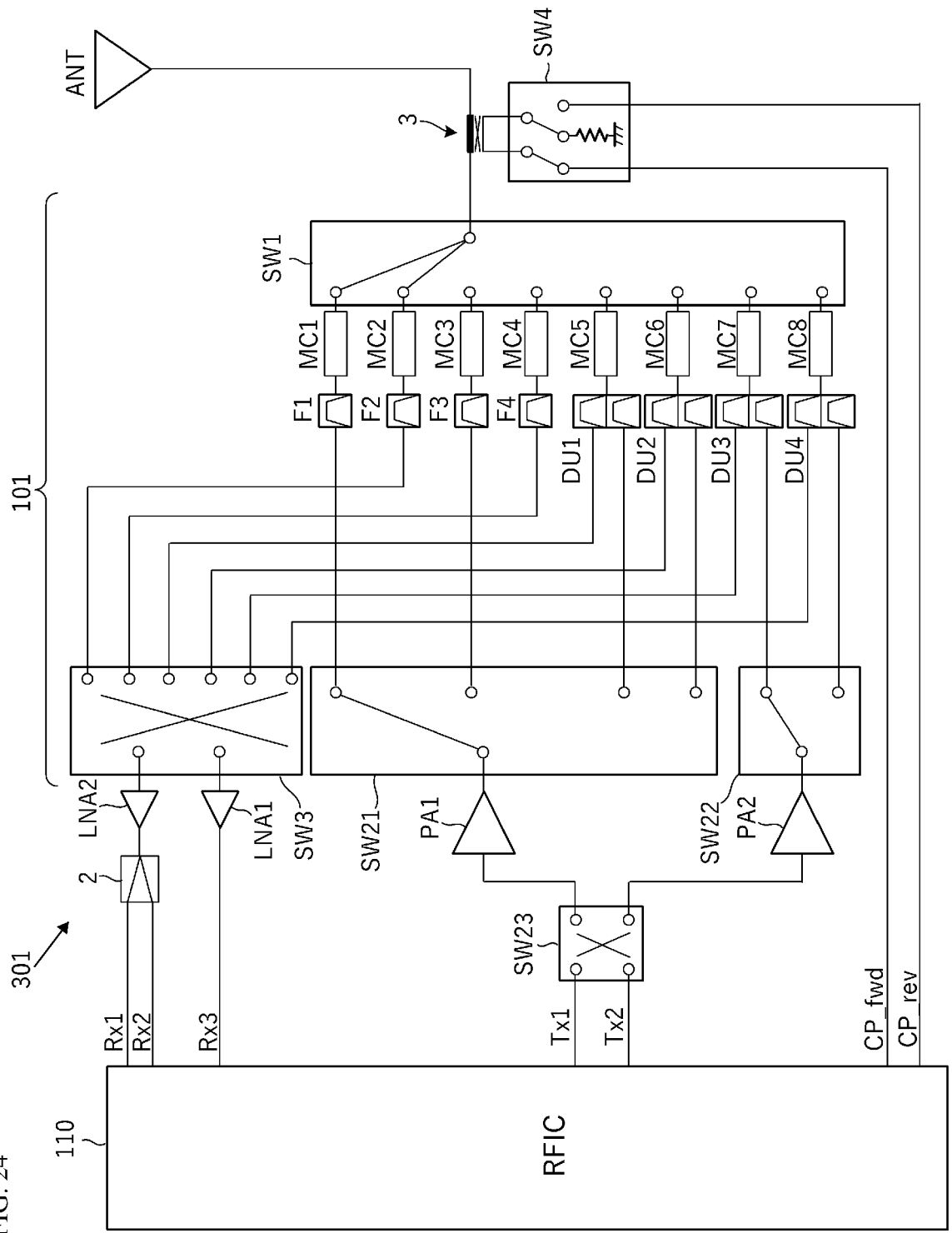
FIG. 24 is a block diagram illustrating a communication apparatus according to a sixth embodiment.

A sixth embodiment describes an exemplary communication apparatus. FIG. 24 is a block diagram illustrating a communication apparatus 301 according to the sixth embodiment. The communication apparatus 301 includes filters F1 to F4, duplexers DU1 to DU4, impedance matching circuits MC1 to MC8, power amplifier circuits PA1 and PA2, low-noise amplifier circuits LNA1 and LNA2, a distribution circuit 2, a coupler 3, switches SW1, SW21, SW22, SW23, SW3, and SW4, an antenna ANT, and an RFIC 110. The filter F2 corresponds to a "wide-band filter" according to the embodiments of the present disclosure. The RFIC 110 corresponds to a "communication circuit" according to the embodiments of the present disclosure.

Lines for control signals from the RFIC 110 to the switches SW1, SW21, SW22, SW23, SW3, and SW4 are not illustrated. The communication apparatus 301 includes a frontend circuit 101.

The switch SW1 is an antenna switch. The switch SW23 selects which, the power amplifier circuit PA1 or the power amplifier circuit PA2, is to be supplied with a transmit signal Tx1, and which, the power amplifier circuit PA1 or the power amplifier circuit PA2, is to be supplied with a transmit signal Tx2. The power amplifier circuit PA1 and the power amplifier circuit PA2 are disposed individually so as to handle a high frequency band and a low frequency band. The switch SW21 supplies one or more of the filters F1 and F3 and the transmit filters of the duplexers DU1 and DU2 with output signals from the power amplifier circuit PA1. The switch SW22 supplies one or both of the transmit filters of the duplexers DU3 and DU4 with output signals from the power amplifier circuit PA2.

The switch SW3 selects an output signal(s) from one or more of the filters F2 and F4 and the receive filters of the duplexers DU1 to DU4, and supplies the selected signal(s) to the low-noise amplifier circuits LNA1 and/or LNA2. The distribution circuit 2 distributes an output signal from the low-noise amplifier circuit LNA2.

The switch SW4 switches between output signals from the coupler 3. The RFIC 110 detects a transmit power signal (CP_fwd) or a receive power signal (CP_rev) through switching of the switch SW4.

The communication apparatus 301 is thus configured to have the frontend circuit 101, the low-noise amplifier circuits LNA1 and LNA2, the power amplifier circuits PA1 and PA2, and the RFIC 110. The low-noise amplifier circuits LNA1 and LNA2 subjects receive signals, which have passed through the wide-band filter F2, to low-noise amplification. The power amplifier circuits PA1 and PA2 amplify transmit signals to input the amplified signals to transmit filters. The RFIC 110 is connected to the outputs of the low-noise amplifier circuits LNA1 and LNA2 and the inputs of the power amplifier circuits PA1 and PA2.

Seventh Embodiment

A seventh embodiment describes a frontend circuit and a frontend module using a variable bandpass filter.

Figure 25A:
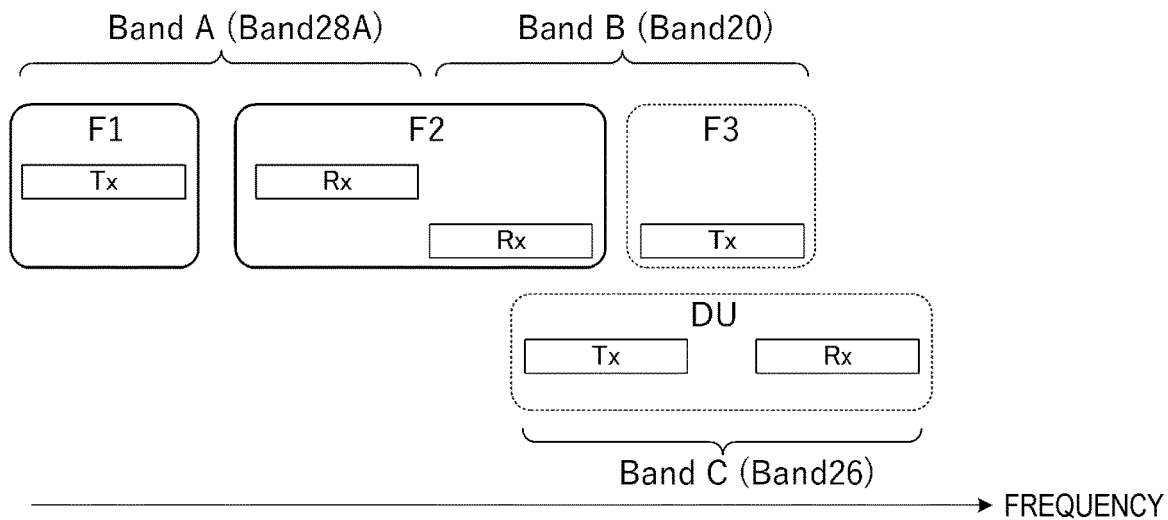
FIGS. 25A and 25B are diagrams illustrating the relationships between frequency bands, to which a frontend circuit according to a seventh embodiment is applied.
Figure 25B:
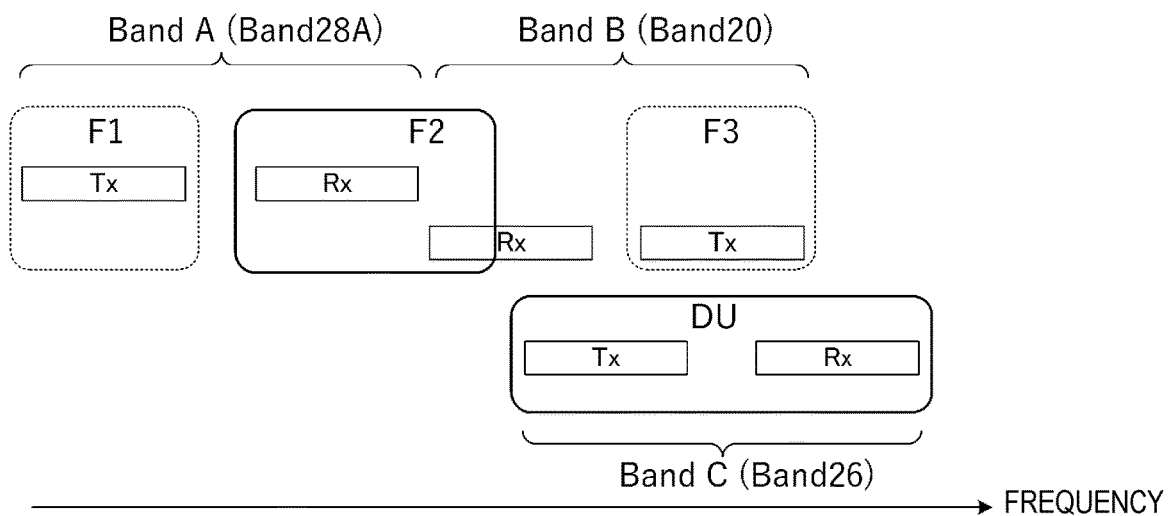

FIGS. 25A and 25B are diagrams illustrating the relationships between the frequency bands, to which a frontend circuit according to the seventh embodiment is applied. In FIGS. 25A and 25B, Band A, Band B, and Band C correspond to Band28A, Band20, and Band26, respectively, among the frequency bands defined in E-UTRA (LTE). In each communication frequency band, Tx indicates its transmit frequency band, and Rx indicates its receive frequency band.

FIG. 25A indicates use of a filter F1 and a filter F2 in two-downlink one-uplink carrier aggregation using the receive frequency band of the first communication frequency band, Band A, the receive frequency band of the second communication frequency band, Band B, and the transmit frequency band of the first communication frequency band, Band A, as surrounded by using the solid-line frames.

FIG. 25B indicates use of the filter F2 and a duplexer DU in two-downlink one-uplink carrier aggregation using the receive frequency band of the first communication frequency band, Band A, the receive frequency band of the third communication frequency band, Band C, and the transmit frequency band of the third communication frequency band, Band C, as surrounded by using the solid-line frames.

The pass frequency band of the filter F2 in the example in FIG. 25A is different from that in the example in FIG. 25B.

Figure 26:
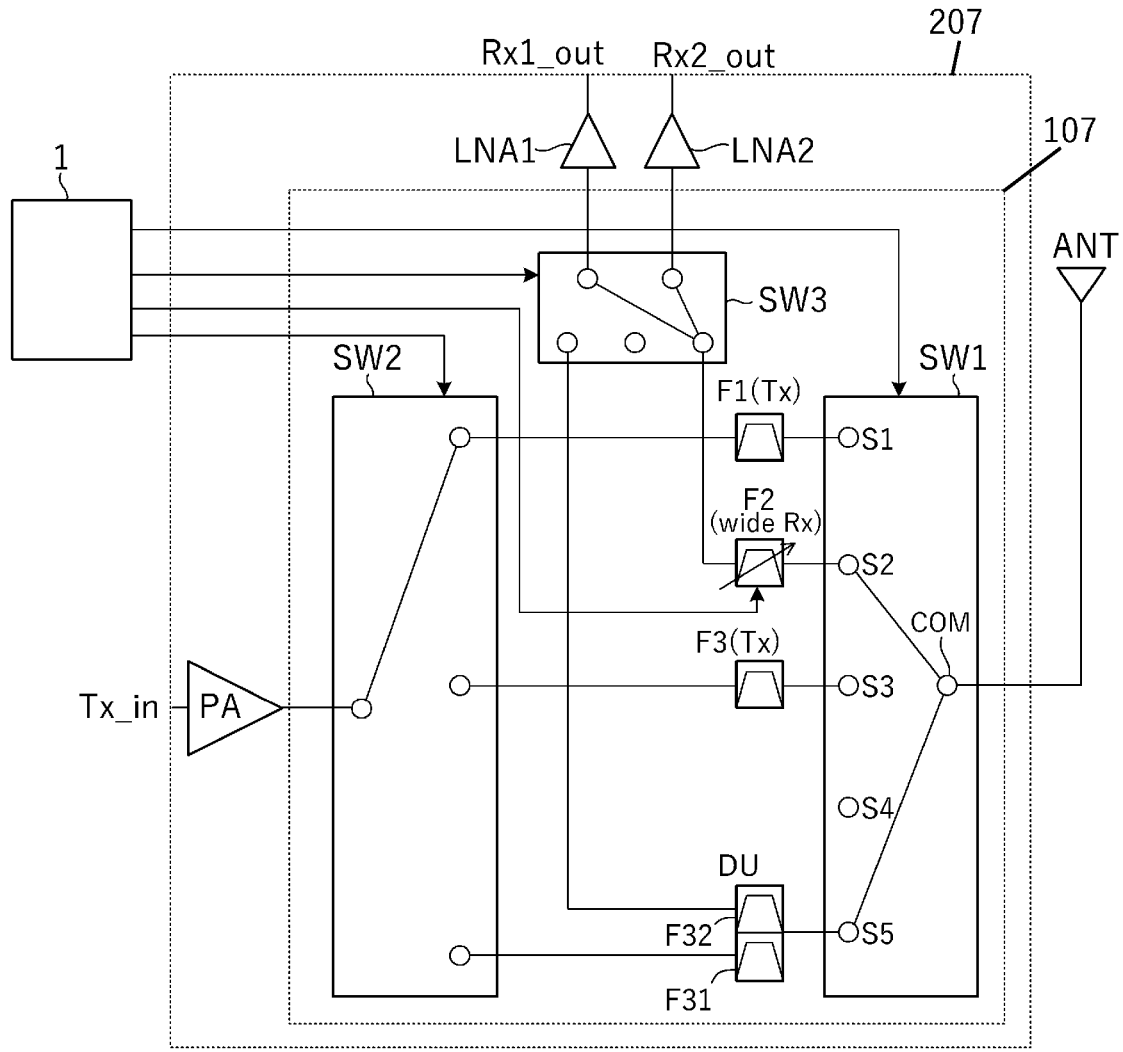
FIG. 26 is a block diagram illustrating a frontend circuit and a frontend module according to the seventh embodiment.

FIG. 26 is a block diagram illustrating a frontend circuit 107 and a frontend module 207 according to the seventh embodiment. The frontend circuit 107 is different from the frontend circuit 101 in FIG. 2 in that the filter F2 of the frontend circuit 107 is a variable bandpass filter whose pass frequency band varies in accordance with a control signal. A switch controller 1 of the frontend circuit 107 according to the seventh embodiment has a function of supplying a control signal to the filter F2. Unlike the frontend circuit 101 in FIG. 2, the frontend circuit 107 according to the seventh embodiment does not include the filter F4. The other configuration is the same as that in the first embodiment.

As illustrated in FIG. 25A, in two-downlink one-uplink carrier aggregation using the receive frequency band of the first communication frequency band, Band A, the receive frequency band of the second communication frequency band, Band B, and the transmit frequency band of the first communication frequency band, Band A, the filter F2 passes continuous wide bands consisting of the receive frequency band of the first communication frequency band, Band A and the receive frequency band of the second communication frequency band, Band B.

As illustrated in FIG. 25B, in two-downlink one-uplink carrier aggregation using the receive frequency band of the first communication frequency band, Band A, the receive frequency band of the third communication frequency band, Band C, and the transmit frequency band of the third communication frequency band, Band C, the filter F2 passes the receive frequency band of the first communication frequency band, Band A in a range excluding the overlapping range of the transmit frequency band of the third communication frequency band, Band C.

Figure 27:
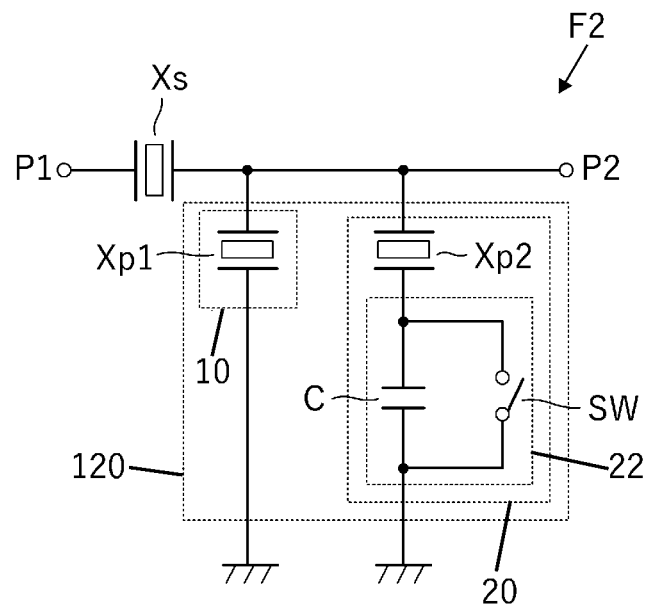
FIG. 27 is a circuit diagram illustrating an exemplary configuration of a variable bandpass filter.

FIG. 27 is a circuit diagram illustrating an exemplary configuration of the variable bandpass filter F2. The variable bandpass filter F2 includes a serial arm resonator Xs, which is connected in series between input/output ports P1 and P2, and a parallel arm circuit 120 which is shunt-connected between the port P2 and the ground. The parallel arm circuit 120 includes parallel arm resonators Xp1 and Xp2, a switch SW, and a capacitor C. The configuration of the variable bandpass filter F2 is disclosed in International Publication No. 2017/204346.

The serial arm circuit is not limited to this, and may be a resonant circuit including multiple resonators, such as a longitudinally coupled resonant device. The serial arm circuit is not limited to a resonant circuit, and may be an impedance device, such as an inductor or a capacitor.

The parallel arm circuit 120 has at least two resonant frequencies and at least two anti-resonant frequencies, and both at least one resonant frequency and at least one anti-resonant frequency shift to the lower frequency side or the higher frequency side in accordance with ON (conducting)

or OFF (non-conducting) of the switch SW. This will be described below in addition to the bandpass characteristics of the filter F2.

The filter F2 having such a configuration causes both at least one of the at least two resonant frequencies in the parallel arm circuit 120 and at least one of the at least two anti-resonant frequencies in the parallel arm circuit 120 to shift to the lower frequency side or the higher frequency side due to the switch SW switching between ON and OFF.

In the example in FIG. 27, a variable frequency circuit 22 is connected between the parallel arm resonator Xp2 and the ground. However, the connection order of the parallel arm resonator Xp2 and the variable frequency circuit 22 is not particularly limiting. The reverse order may be used. If the connection order is reversed, the insertion loss in the passband of the filter F2 degrades. When the parallel arm resonator and a different acoustic wave resonator are formed in a chip (package) for resonators, the chip size increases due to an increasing number of terminals of the chip. Therefore, connection in the connection order illustrated in FIG. 27 is desirable in terms of the filter characteristics and a reduction in size.

The parallel arm resonator Xp1 is a first parallel arm resonator which is a resonator connected between the ground and a node on the path connecting the input/output port P1 to the input/output port P2. In this example, the parallel arm resonator Xp1 forms a first circuit 10. In this example, the first circuit 10 is formed only of the parallel arm resonator Xp1.

The parallel arm resonator Xp2 is a second parallel arm resonator. In this example, the parallel arm resonator Xp2, the switch SW, and the capacitor C form a second circuit 20 connected to the first circuit 10 in parallel.

The parallel arm resonator Xp2 has a resonant frequency, which is different from the resonant frequency of the parallel arm resonator Xp1, and an anti-resonant frequency which is different from the anti-resonant frequency of the parallel arm resonator Xp1. In this example, the resonant frequency of the parallel arm resonator Xp1 is lower than the resonant frequency of the parallel arm resonator Xp2, and the anti-resonant frequency of the parallel arm resonator Xp1 is lower than the anti-resonant frequency of the parallel arm resonator Xp2. The "resonant frequency" is a frequency at which impedance is minimum, and the "anti-resonant frequency" is a frequency at which impedance is maximum.

The capacitor C is an impedance device connected in series to the parallel arm resonator Xp2. The variable frequency width of the passband of the filter F2 depends on the element value of the capacitor C. For example, the smaller the element value of the capacitor C is, the wider the variable frequency width is. Therefore, the element value of the capacitor C may be determined as appropriate in accordance with the frequency specification required for the filter F2. The capacitor C may be a variable capacitor, such as a varicap or a digitally tunable capacitor (DTC).

The switch SW is, for example, a single pole single throw (SPST) switch device. The switch SW switches between conducting (ON) and non-conducting (OFF) in accordance with a control signal from a controller (the switch controller 1 in FIG. 26).

The switch SW is, for example, a field effect transistor (FET) switch, which is formed of gallium arsenide (GaAs) or complementary metal oxide semiconductor (CMOS), or a diode switch.

In the seventh embodiment, the resonators (the serial arm resonator Xs and the parallel arm resonators Xp1 and Xp2) included in the filter F2 are surface acoustic wave resonators using surface acoustic waves. Thus, the filter F2 may be formed by using interdigital transducer (IDT) electrodes formed on a substrate having at least a part having piezoelectricity, achieving a small and low-profile filter circuit having very steep bandpass characteristics.

Figure 28A:
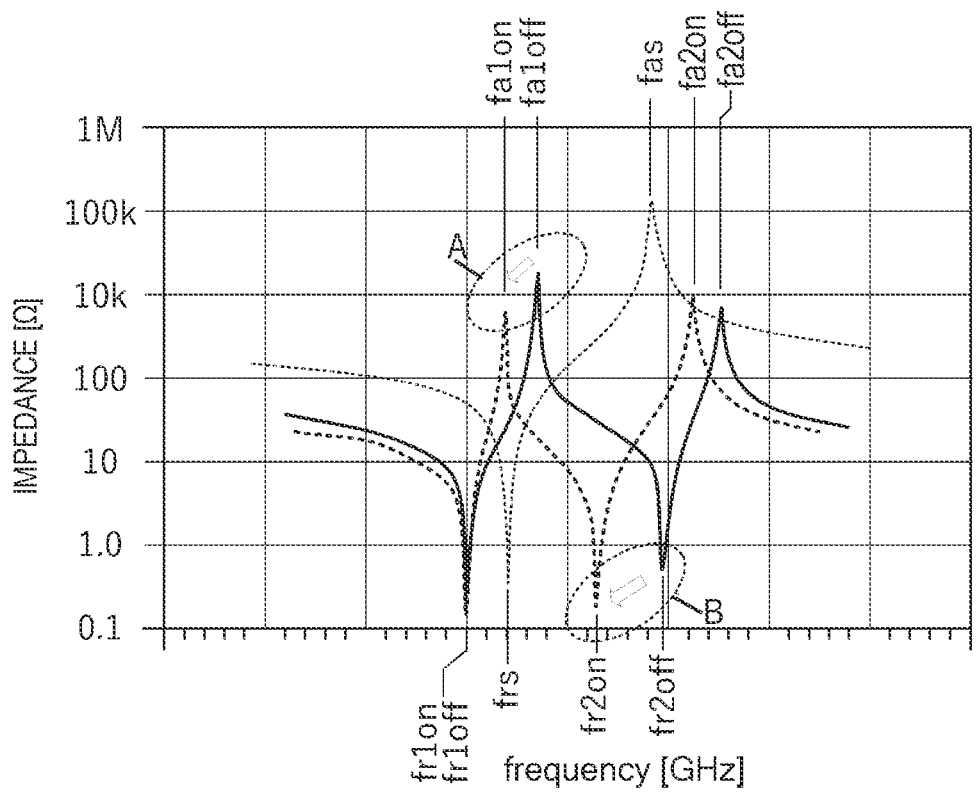
FIG. 28A is a diagram illustrating frequency characteristics of the impedance of a filter.
Figure 28B:
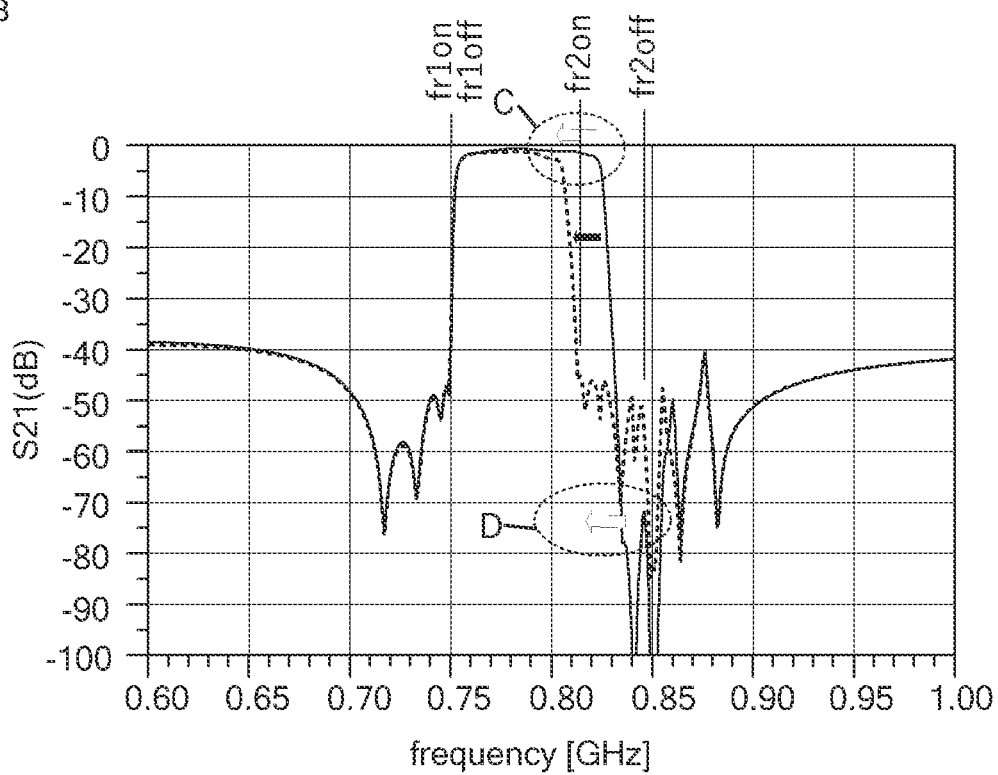
FIG. 28B is a diagram illustrating frequency characteristics of the insertion loss of a filter.

FIG. 28A is a diagram illustrating frequency characteristics of the impedance of the filter F2. FIG. 28B is a diagram illustrating frequency characteristics of the insertion loss of the filter F2. The serial arm resonator Xs illustrated in FIG. 27 has a resonant frequency frs and an anti-resonant frequency fas.

When the switch SW illustrated in FIG. 27 is on, the switch SW short-circuits the capacitor C, and the impedance characteristics of the parallel arm circuit 120 does not receive an influence of the capacitor 22C. That is, the composite characteristics of the two parallel arm resonators (the parallel arm resonators Xp1 and Xp2) constitute impedance characteristics of the parallel arm circuit 120.

That is, when the switch SW is off, the filter F2 has the following bandpass characteristics: the passband is defined by an anti-resonant frequency fa1off and the resonant frequency frs; the pole (attenuation pole) on the lower passband side is defined by a resonant frequency fr1on; the pole (attenuation pole) on the higher passband side is defined by a resonant frequency fr2off and the anti-resonant frequency fas.

When the switch SW is on, the parallel arm circuit 120 shifts both the higher one of the two resonant frequencies and the lower one of the two anti-resonant frequencies to the lower frequency side. According to the seventh embodiment, only the parallel arm resonator Xp2 is connected in series to the capacitor C and the switch SW. This causes the higher one of the two resonant frequencies to shift from fr2off to fr2on, that is, to the lower frequency side (part B in FIG. 28A). The lower one of the anti-resonant frequencies shifts from fa1off to fa1on, that is, to the lower frequency side (part A in FIG. 28A).

The relation, frs<fas and (fr1on, fr1off)<frs<fr2on, is satisfied. Therefore, the lower one of the anti-resonant frequencies and the higher one of the resonant frequencies of the parallel arm circuit 120 define the attenuation slope on the high-frequency passband side of the filter F2. The switch SW, which is on, causes these to shift to the lower frequency side. That is, as illustrated in FIG. 28B, the switch SW is switched from off to on so that, in the bandpass characteristics of the filter F2, the attenuation slope on the high-frequency passband side shifts to the lower frequency side (the black arrow in FIG. 28B) while the steep slope is maintained. In other words, the filter F2 shifts the attenuation pole on the high-frequency passband side to the lower frequency side (part D in FIG. 28B). At the same time, the filter F2 causes the high-frequency passband end to shift to the lower frequency side while an increase in the insertion loss at the high-frequency passband end is suppressed (part C in FIG. 28B).

The description about the embodiments is exemplary in all respects, and is not limiting. Changes and modifications may be made as appropriate by those skilled in the art. The scope of the present disclosure is defined by the scope of claims, not by the embodiments describe above. The scope of the present disclosure encompasses changes made from the embodiments within the scope of claims and the equivalent scope.

For example, the exemplary carrier aggregation described above is mainly related to downlinks. Similarly, carrier aggregation related to uplinks may be performed.

The examples illustrated in FIG. 1 and the like describe the state in which the first communication frequency band, Band A, is lower than the second communication frequency band, Band B. The same is true for the state in which two contiguous frequency bands have the reverse high-low relationship.

For example, a power amplifier circuit may be disposed for each transmit frequency band.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A frontend circuit applied to carrier aggregation using a plurality of communication frequency bands including a first communication frequency band and a second communication frequency band, the frontend circuit comprising:
    a wide-band filter that passes a radio frequency signal of the first communication frequency band and a radio frequency signal of the second communication frequency band; and
    a first filter that passes the radio frequency signal of the first communication frequency band selectively,
    wherein the first communication frequency band is close to or overlaps the second communication frequency band,
    wherein, in the carrier aggregation, the radio frequency signal of the first communication frequency band and the radio frequency signal of the second communication frequency band pass through the wide-band filter,
    wherein the first communication frequency band or the second frequency communication band includes a receive frequency band that is lower than a transmit frequency band, and
    wherein, in a single use of the first communication frequency band, the radio frequency signal of the first communication frequency band passes through the first filter.

2. The frontend circuit according to claim 1,
    wherein, in the single use of the first communication frequency band, the wide-band filter is isolated.

3. A frontend module comprising:
    the frontend circuit according to claim 2; and
    a low-noise amplifier circuit which performs low-noise amplification on a receive signal having passed through the wide-band filter.

4. A frontend module comprising:
    the frontend circuit according to claim 2;
    a transmit filter that passes a transmit frequency band of the first communication frequency band or a transmit frequency band of the second communication frequency band; and
    a power amplifier circuit that amplifies power of a transmit signal which is inputted to the transmit filter.

5. The frontend circuit according to claim 1,
    wherein, in a single use of the first communication frequency band or the second communication frequency band, the radio frequency signal of the first communication frequency band or the radio frequency signal of the second communication frequency band passes through the wide-band filter.

6. The frontend circuit according to claim 5, further comprising:
    a third filter that passes a radio frequency signal of a third communication frequency band, the third filter having a pass frequency band different from a pass frequency band of the wide-band filter,
    wherein, in the carrier aggregation using the first communication frequency band or the second communication frequency band, and the third communication frequency band, the radio frequency signal of the first communication frequency band or the radio frequency signal of the second communication frequency band passes through the wide-band filter.

7. A frontend module comprising:
    the frontend circuit according to claim 5; and
    a low-noise amplifier circuit which performs low-noise amplification on a receive signal having passed through the wide-band filter.

8. A frontend module comprising:
    the frontend circuit according to claim 5;
    a transmit filter that passes a transmit frequency band of the first communication frequency band or a transmit frequency band of the second communication frequency band; and
    a power amplifier circuit that amplifies power of a transmit signal which is inputted to the transmit filter.

9. The frontend circuit according to claim 1, further comprising:
    a first filter that passes the radio frequency signal of the first communication frequency band; and
    a fourth filter that passes a radio frequency signal of a fourth communication frequency band,
    wherein the frontend circuit is applied to the carrier aggregation using the first communication frequency band and the fourth communication frequency band,
    wherein the fourth communication frequency band overlaps the second communication frequency band at least partially, and
    wherein, in the carrier aggregation using the first communication frequency band and the fourth communication frequency band, the wide-band filter is isolated, the radio frequency signal of the first communication frequency band passes through the first filter, and the radio frequency signal of the fourth communication frequency band passes through the fourth filter.

10. A frontend module comprising:
    the frontend circuit according to claim 9; and
    a low-noise amplifier circuit which performs low-noise amplification on a receive signal having passed through the wide-band filter.

11. The frontend circuit according to claim 1, further comprising:
    a first filter that passes the radio frequency signal of the first communication frequency band; and
    a fourth filter that passes a radio frequency signal of a fourth communication frequency band,
    wherein the frontend circuit is applied to the carrier aggregation using the first communication frequency band and the fourth communication frequency band,
    wherein there is no overlapping range between the fourth communication frequency band and the first communication frequency band, and
    wherein, in the carrier aggregation using the first communication frequency band and the fourth communication frequency band, the wide-band filter is isolated, the radio frequency signal of the first communication frequency band passes through the first filter, and the radio frequency signal of the fourth communication frequency band passes through the fourth filter.

12. The frontend circuit according to claim 1,
wherein the plurality of communication frequency bands includes a third communication frequency band which overlaps the second communication frequency band, and
wherein the wide-band filter is a variable bandpass filter having a passband width, the passband width being switched in accordance with a control signal between a first case and a second case, the first case being the carrier aggregation using the first communication frequency band and the second communication frequency band, and the second case being the carrier aggregation using the first communication frequency band and the third communication frequency band.

13. The frontend circuit according to claim 1, further comprising:
a multiplexer that includes an input port for a transmit signal in the first communication frequency band, an input port for a transmit signal in the second communication frequency band, an output port for a receive signal in the first communication frequency band and the second communication frequency band, and a common input/output port.

14. A frontend module comprising:
the frontend circuit according to claim 1; and
a low-noise amplifier circuit which performs low-noise amplification on a receive signal having passed through the wide-band filter.

15. The frontend module according to claim 14, further comprising:
a distribution circuit that distributes a receive signal or an output signal, the receive signal having passed through the wide-band filter, and the output signal being outputted from the low-noise amplifier circuit.

16. A communication apparatus comprising:
the frontend module according to claim 14; and
a communication circuit that is connected to the frontend module.

17. A communication apparatus comprising:
the frontend module according to claim 15; and
a communication circuit that is connected to the frontend module.

18. A frontend module comprising:
the frontend circuit according to claim 1;
a transmit filter that passes a transmit frequency band of the first communication frequency band or a transmit frequency band of the second communication frequency band; and
a power amplifier circuit that amplifies power of a transmit signal which is inputted to the transmit filter.

19. A multiplexer applied to carrier aggregation using a plurality of communication frequency bands including a first communication frequency band and a second communication frequency band, the first communication frequency band being close to or overlapping the second communication frequency band, the multiplexer comprising:
a wide-band filter that passes a radio frequency signal of the first communication frequency band and a radio frequency signal of the second communication frequency band;
a first filter that passes the radio frequency signal of the first communication frequency band selectively,
wherein, in the carrier aggregation, the radio frequency signal of the first communication frequency band and the radio frequency signal of the second communication frequency band pass through the wide-band filter,
wherein the first communication frequency band or the second frequency communication band includes a receive frequency band that is lower than a transmit frequency band, and
wherein, in a single use of the first communication frequency band, the radio frequency signal of the first communication frequency band passes through the first filter.

20. The multiplexer according to claim 19, further comprising:
an input port for a transmit signal in the first communication frequency band;
an input port for a transmit signal in the second communication frequency band;
an output port for a receive signal in the first communication frequency band and the second communication frequency band; and
a common input/output port,
wherein the wide-band filter is disposed between the output port for the receive signal and the common input/output port.

* * * * *